(12) United States Patent
Kodama et al.

(10) Patent No.: US 12,081,241 B2
(45) Date of Patent: Sep. 3, 2024

(54) CODE TABLE GENERATION DEVICE, MEMORY SYSTEM, AND CODE TABLE GENERATION METHOD

(71) Applicant: Kioxia Corporation, Tokyo (JP)

(72) Inventors: Sho Kodama, Yokohama Kanagawa (JP); Masato Sumiyoshi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 83 days.

(21) Appl. No.: 17/941,345

(22) Filed: Sep. 9, 2022

(65) Prior Publication Data

US 2023/0283295 A1    Sep. 7, 2023

(30) Foreign Application Priority Data

Mar. 1, 2022  (JP) ................. 2022-030927

(51) Int. Cl.
*H03M 7/40*   (2006.01)
*H03M 7/30*   (2006.01)

(52) U.S. Cl.
CPC ......... *H03M 7/405* (2013.01); *H03M 7/3077* (2013.01); *H03M 7/3079* (2013.01); *H03M 7/4062* (2013.01)

(58) Field of Classification Search
CPC .. H03M 7/405; H03M 7/3077; H03M 7/4062; H03M 7/3079
USPC .................................... 341/65, 67
See application file for complete search history.

(56) References Cited

U.S. PATENT DOCUMENTS

| 7,609,182 B2 * | 10/2009 | Owsley ............... H03M 7/40 |
| | | 341/51 |
| 9,337,862 B2 | 5/2016 | Wu et al. |
| 10,694,217 B2 | 6/2020 | Satpathy et al. |
| 10,756,758 B1 * | 8/2020 | Abali .............. H03M 7/3077 |

OTHER PUBLICATIONS

Deutsch, P., "DEFLATE Compressed Data Format Specification version 1.3", RFC 1951, May 1996, pp. 1-15, Doi: 10.17487/RFC1951, https://datatracker.ietf.org/doc/html/rfc1951/.

* cited by examiner

*Primary Examiner* — Khai M Nguyen
(74) *Attorney, Agent, or Firm* — Maier & Maier, PLLC

(57) ABSTRACT

According to one embodiment, a code table generation device includes a table generation unit, a merge unit and a tree generation unit. The table generation unit generates a frequency table including symbols and frequencies of occurrence respectively associated with the symbols, based on a frequency of occurrence for each symbol of input symbols. The merge unit acquires top K symbols in descending order of the frequencies of occurrence and remaining symbols from the symbols, divides the remaining symbols into one or more symbol sets, and determines a frequency of occurrence associated with a root node of each of subtrees correspond to the respective symbol sets. The tree generation unit generates a Huffman tree using the K symbols and the root node of each of the subtrees.

17 Claims, 13 Drawing Sheets

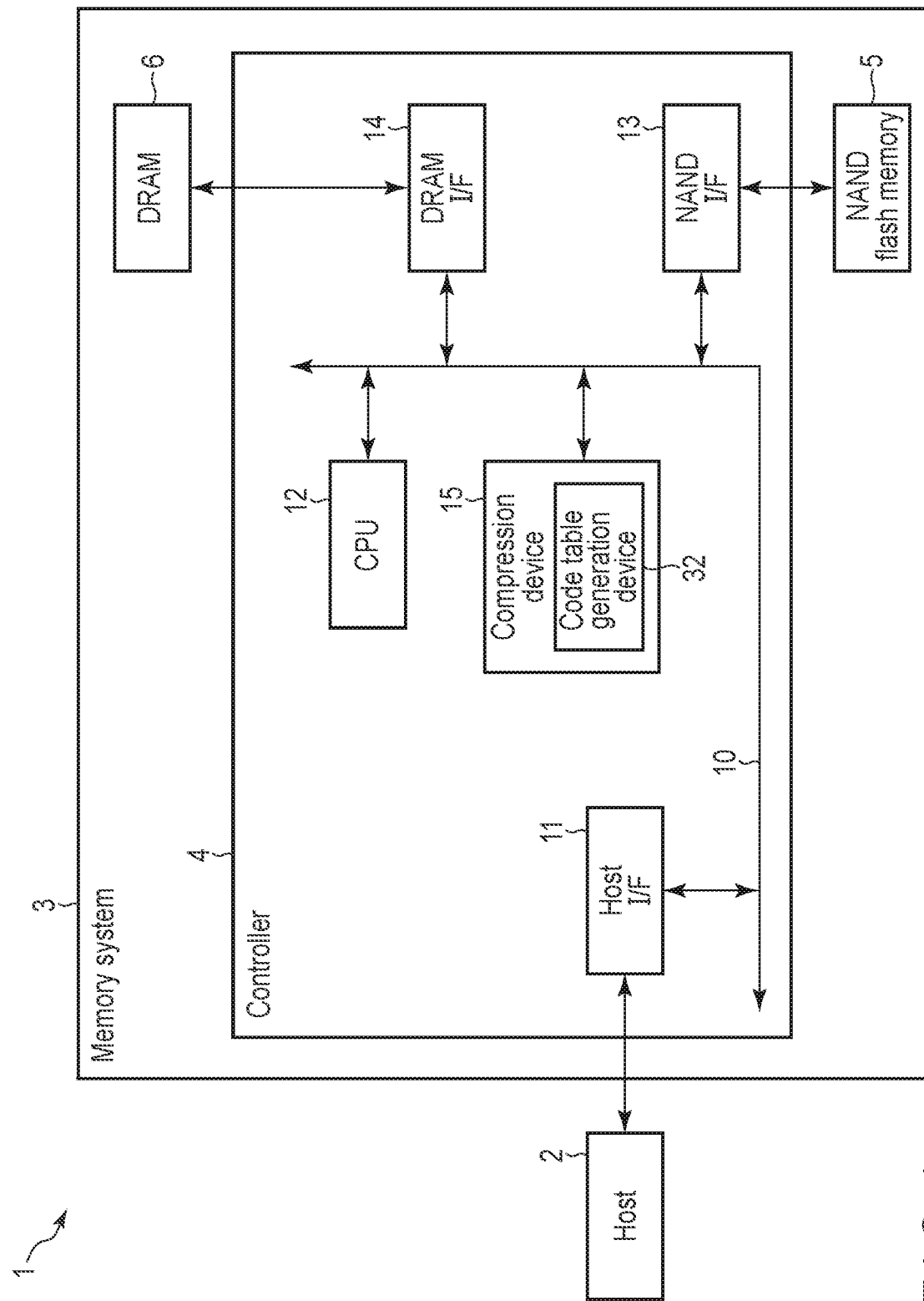
F I G. 1

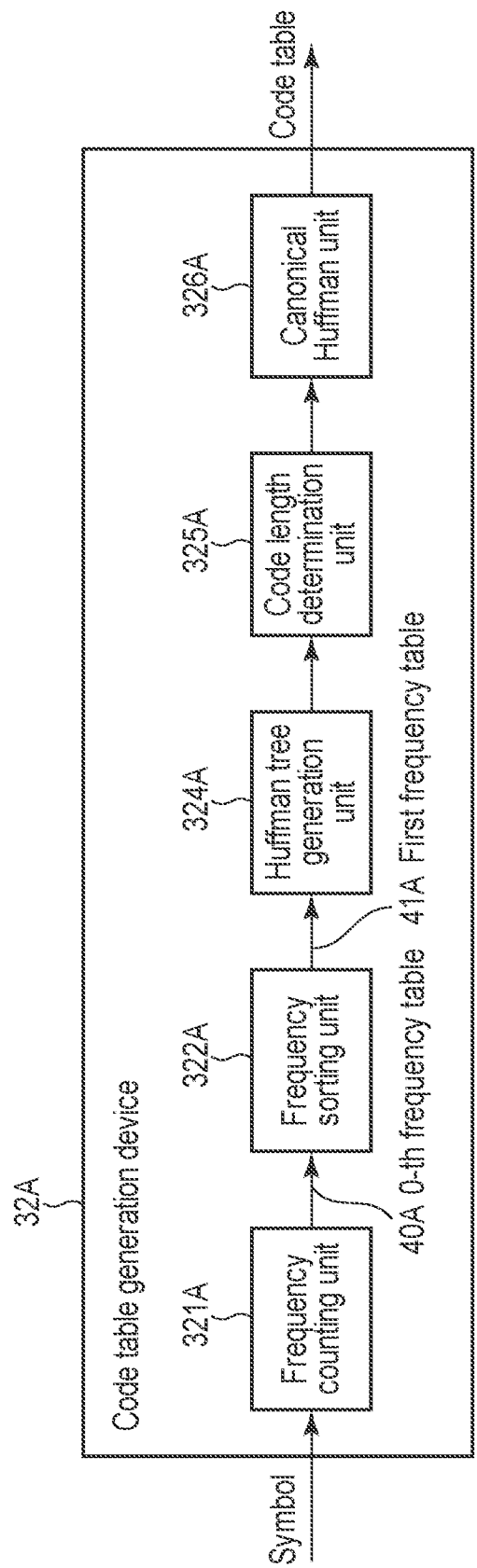
F I G. 2

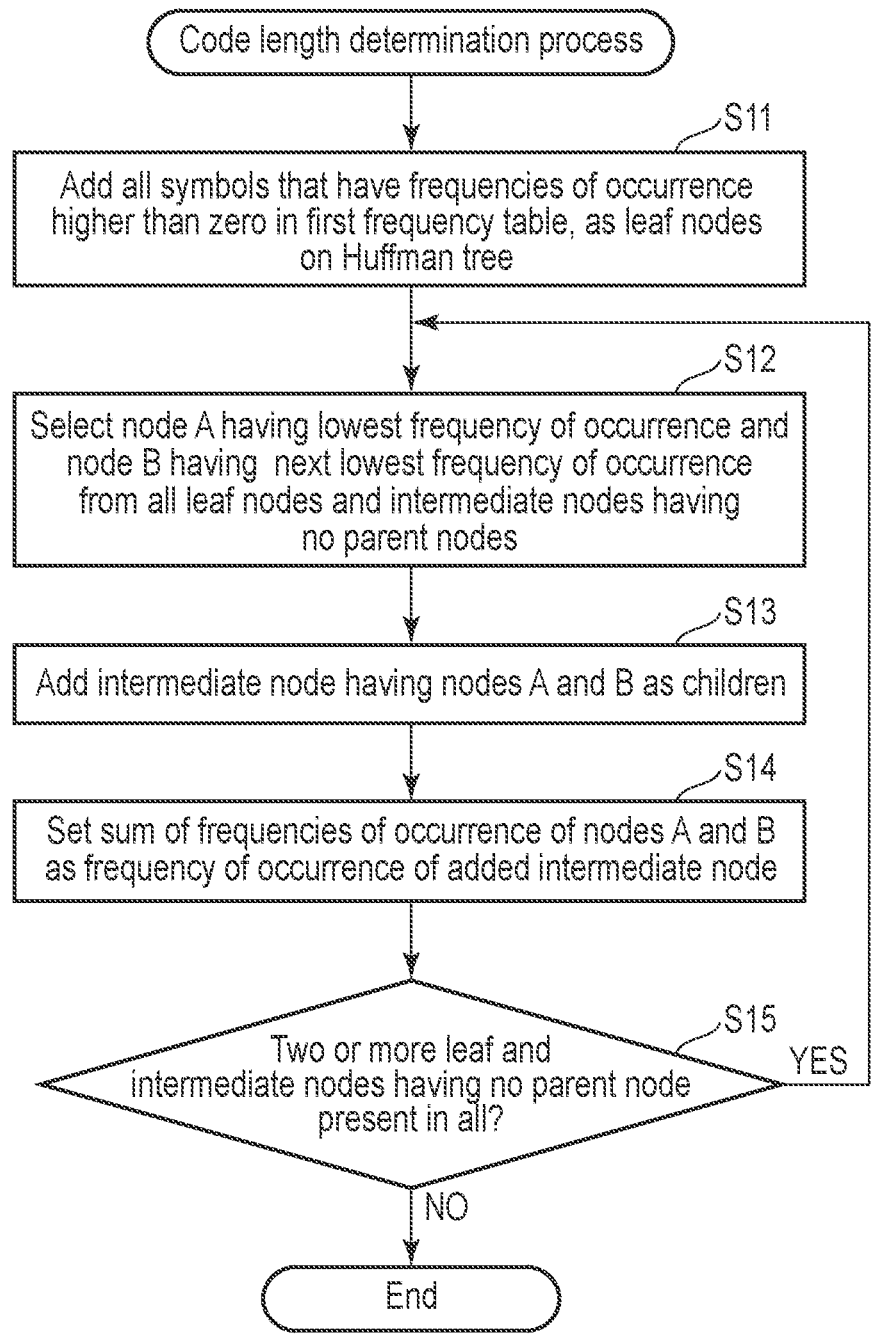
F I G. 3

| Symbol | Frequency of occurrence |
|---|---|
| a | 120 |
| b | 60 |
| c | 29 |
| d | 14 |
| e | 4 |
| f | 3 |
| g | 3 |
| h | 2 |
| i | 0 |
| j | 0 |
| ⋮ | ⋮ |

| Symbol | Code length |
|--------|-------------|
| a | 1 |
| b | 2 |
| c | 3 |
| d | 4 |
| e | 6 |
| f | 6 |
| g | 6 |
| h | 6 |

FIG. 6

| Index | Symbol number | Frequency of occurrence |
|---|---|---|
| 0 | 0 | 3 |
| 1 | 1 | 16 |
| 2 | 2 | 1 |
| 3 | 3 | 0 |
| ... | ... | ... |
| 253 | 253 | 30 |
| 254 | 254 | 0 |
| 255 | 255 | 4 |

FIG. 8

| Index | Symbol number | Frequency of occurrence |
|---|---|---|
| 0 | 64 | 50 |
| 1 | 253 | 30 |
| 2 | 80 | 25 |
| 3 | 1 | 16 |
| ... | ... | ... |
| 253 | 75 | 0 |
| 254 | 100 | 0 |
| 255 | 8 | 0 |

FIG. 9

(a) First frequency table

| Index | Symbol number | Frequency of occurrence |
|---|---|---|
| 0 | 64 | 50 |
| 1 | 253 | 30 |
| 2 | 80 | 25 |
| 3 | 1 | 16 |
| ... | ... | ... |
| 30 | 4 | 4 |
| 31 | 200 | 3 |
| 32 | 103 | 2 |
| 33 | 95 | 2 |
| 34 | 107 | 1 |
| ... | ... | ... |
| 253 | 75 | 0 |
| 254 | 100 | 0 |
| 255 | 8 | 0 |

(b) First part table

| Index | Symbol number | Frequency of occurrence |
|---|---|---|
| 0 | 64 | 50 |
| 1 | 253 | 30 |
| 2 | 80 | 25 |
| 3 | 1 | 16 |
| ... | ... | ... |
| 30 | 4 | 4 |
| 31 | 200 | 3 |

(c) Second part table

| Index | Symbol number | Frequency of occurrence |
|---|---|---|
| 0 | 103 | 2 |
| 1 | 95 | 2 |
| 2 | 107 | 1 |
| ... | ... | ... |
| 221 | 75 | 0 |
| 222 | 100 | 0 |
| 223 | 8 | 0 |

F I G. 10

```
code:=0
while more symbols do //assign in ascending code length order and in predetermined
symbol order in case of same code length
code bit string of symbol=code
   code:=(code+1) <<((bit length of the next symbol) - (current bit length))
```
F I G. 13
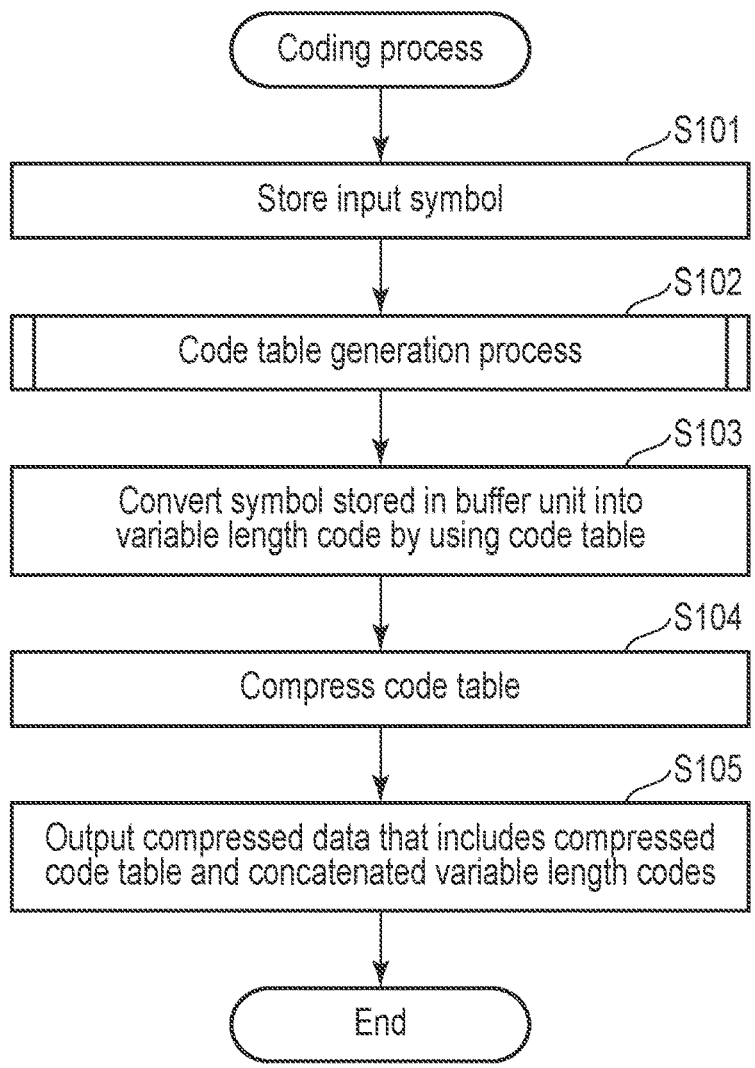
F I G. 14

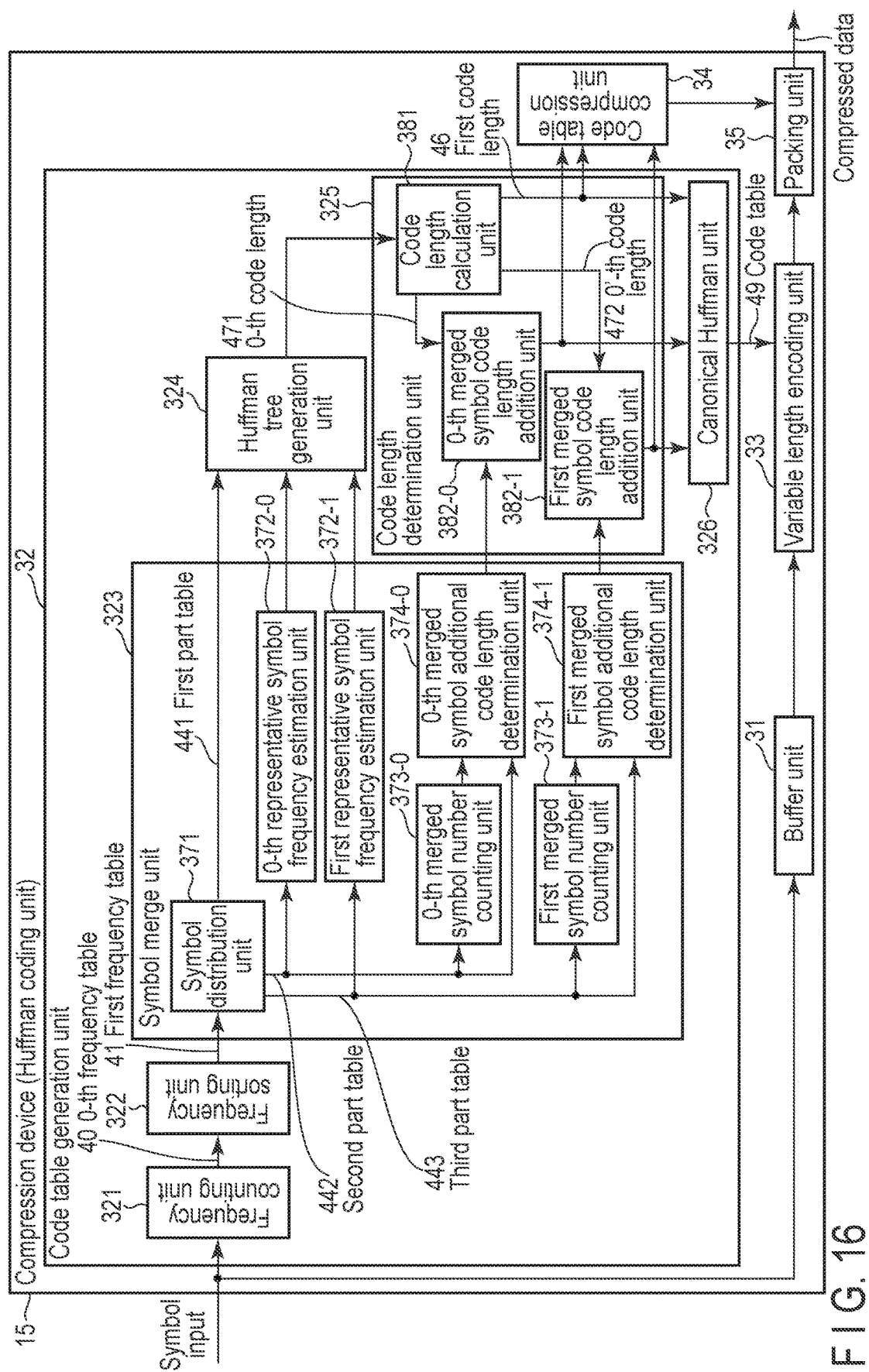
F I G. 16

CODE TABLE GENERATION DEVICE, MEMORY SYSTEM, AND CODE TABLE GENERATION METHOD

CROSS-REFERENCE TO RELATED APPLICATIONS

This application is based upon and claims the benefit of priority from Japanese Patent Application No. 2022-030927, filed Mar. 1, 2022, the entire contents of which are incorporated herein by reference.

FIELD

Embodiments described herein relate generally to a code table generation device, a memory system, and a code table generation method.

BACKGROUND

Dynamic Huffman coding is a variable length coding for dynamically generating a code table based on a frequency of occurrence of each of symbols to be encoded. The code table indicates correspondence between a symbol and a code word that is assigned to the symbol. In the dynamic Huffman coding, a short code word is assigned to a symbol that occurs at a high frequency, and a long code word is assigned to a symbol that occurs at a low frequency.

More specifically, in the dynamic Huffman coding, for example, a Huffman tree including, as leaf nodes, one or more types of symbols that have occurred is constructed. Then, a code length of each of the symbols is determined by using the constructed Huffman tree.

Processing of constructing the Huffman tree and determining the code length of each symbol requires a processing amount proportional to the number of types of symbols that have occurred. Thus, in a case where there are many types of symbols that have occurred, it takes a lot of time for processing of generating a code table, or a circuit scale (for example, the number of gates) of a device increases to complete generation of the code table within a specific time period.

BRIEF DESCRIPTION OF THE DRAWINGS

FIG. 1 is a block diagram illustrating an example of a configuration of an information processing system that includes a code table generation device according to a first embodiment.

FIG. 2 is a block diagram illustrating an example of a configuration of a code table generation device according to a comparative example.

FIG. 3 is a flowchart illustrating an example of the procedure of a code length determination process executed in the code table generation device according to the comparative example.

FIG. 6 is a view illustrating an example of code lengths determined in the code table generation device according to the comparative example.

FIG. 8 is a view illustrating an example of a frequency table (0-th frequency table) generated in the code table generation device according to the first embodiment.

FIG. 9 is a view illustrating an example of a frequency table (first frequency table) sorted in the code table generation device according to the first embodiment.

FIG. 10 is a view illustrating (a) an example of the first frequency table, and (b) an example of a first part table and (c) an example of a second part table that are obtained by dividing the first frequency table, used in the code table generation device according to the first embodiment.

FIG. 13 is a view illustrating an example of a pseudo-program for assigning a code bit string to a symbol that is executed in the code table generation device according to the first embodiment.

FIG. 14 is a flowchart illustrating an example of the procedure of an encoding process executed in the compression device that includes the code table generation device according to the first embodiment.

FIG. 16 is a block diagram illustrating an example of a configuration of a compression device that includes a code table generation device according to a second embodiment.

DETAILED DESCRIPTION

Figures 4, 5:
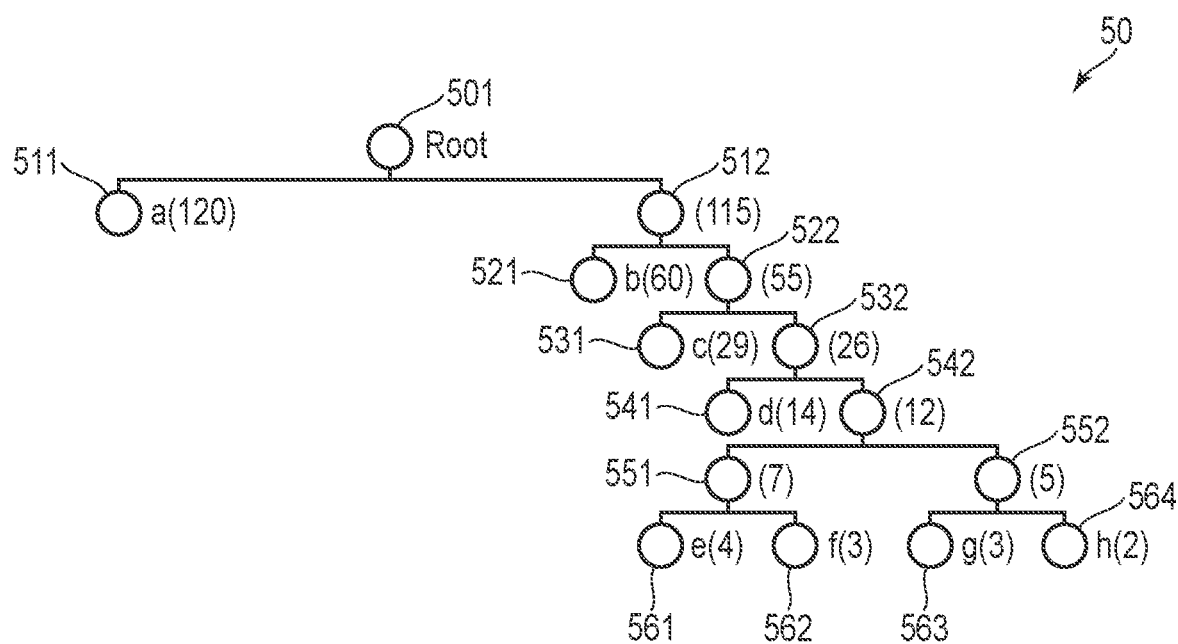
FIG. 4 is a view illustrating a configuration example of a frequency table used in the code table generation device according to the comparative example.
FIG. 5 is a view illustrating an example of a Huffman tree generated in the code table generation device according to the comparative example.

Various embodiments will be described hereinafter with reference to the accompanying drawings.

In general, according to one embodiment, a code table generation device includes a frequency table generation unit, a frequency sorting unit, a symbol merge unit, a Huffman tree generation unit, a code length determination unit, and a code determination unit. The frequency table generation unit generates a frequency table based on a frequency of occurrence for each symbol of input symbols. The frequency table includes a plurality of symbols and a plurality of frequencies of occurrence that are associated with the plurality of symbols, respectively. The frequency sorting unit sorts the plurality of symbols and the plurality of frequencies of occurrence in the frequency table in descending order of the frequencies of occurrence. The symbol merge unit acquires top K symbols and remaining symbols from the sorted plurality of symbols, divides the remaining symbols into one or more symbol sets, and determines a frequency of occurrence associated with a root node of each of one or more subtrees that correspond to the one or more symbol sets, respectively. The Huffman tree generation unit generates a Huffman tree by using the K symbols and the root node of each of the one or more subtrees. The code length determination unit determines a plurality of code lengths that correspond to the plurality of symbols, respectively, based on the Huffman tree and the one or more subtrees. The code determination unit determines a plurality of codes that are assigned to the plurality of symbols, respectively, based on the plurality of code lengths. The K is an integer equal to or greater than one and equal to or less than a number of the plurality of symbols.

First Embodiment

FIG. 1 illustrates an example of a configuration of an information processing system that includes a code table generation device according to a first embodiment. The information processing system 1 includes a host device 2 (hereinafter, referred to as a host 2) and a memory system 3.

The memory system 3 is a semiconductor storage device configured to write data into a nonvolatile memory such as a NAND flash memory 5 and read data from the nonvolatile memory. The memory system 3 is implemented, for example, as a solid state drive (SSD) that includes the NAND flash memory 5. Hereinafter, a case where the memory system 3 is implemented as an SSD will be exemplified, but the memory system 3 may be implemented as a hard disk drive (HDD).

The host 2 may be a storage server that stores a large amount of various data in the memory system 3 or may be a personal computer.

The memory system 3 may be used as a storage for the host 2. The memory system 3 may be built in the host 2 or may be connected to the host 2 via a cable or a network.

An interface for connecting the host 2 and the memory system 3 conforms to SCSI, Serial Attached SCSI (SAS), ATA (AT Attachment), Serial ATA (SATA), PCI Express (PCIe) (registered trademark), Ethernet (registered trademark), Fibre channel, NVM Express (NVMe) (registered trademark), and the like.

The memory system 3 includes a controller 4 and the NAND flash memory 5. The controller 4 may be implemented by a circuit such as a system-on-a-chip (SoC).

The memory system 3 may include a random access memory (RAM) that is a volatile memory, such as a dynamic random access memory (DRAM) 6. Alternatively, a RAM such as a static random access memory (SRAM) may be built in the controller 4. Note that the DRAM 6 may also be built in the controller 4.

The DRAM 6 is a volatile memory. The RAM such as the DRAM 6 includes, for example, a storage area of firmware (FW) and a cache area of a logical-to-physical address conversion table.

The NAND flash memory 5 includes multiple blocks. Each of the blocks includes multiple pages. The blocks each function as a minimum erase unit. A block may be referred to as an erase block or a physical block. Each of the pages includes multiple memory cells connected to a single word line. The pages each function as a unit of a data write operation and a data read operation. Note that a word line may be used as a unit of a data write operation and a data read operation.

The tolerable maximum number of program/erase cycles (maximum number of P/E cycles) for each of the blocks is limited. One P/E cycle of a block includes an erase operation to erase data stored in all memory cells in the block and a write operation to write data in each page of the block.

The controller 4 includes, for example, a host interface (host I/F) 11, a CPU 12, a NAND interface (NAND I/F) 13, a DRAM interface (DRAM I/F) 14, and a compression device 15. The host I/F 11, the CPU 12, the NAND I/F 13, the DRAM I/F 14, and the compression device 15 may be mutually connected through a bus 10.

The controller 4 is electrically connected to the NAND flash memory 5 through the NAND I/F 13 that conforms to an interface standard such as a Toggle DDR and an Open NAND Flash Interface (ONFI). The NAND I/F 13 functions as a NAND control circuit configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping data indicative of relationship between each logical address and each physical address of the NAND flash memory 5, and (2) process to hide a difference between data read operations/data write operations in units of page and data erase operations in units of block. The block management includes management of defective blocks, wear leveling, and garbage collection.

The logical address is an address used by the host 2 for addressing a storage area of the memory system 3. The management of mapping between each logical address and each physical address is executed by using a logical-to-physical address conversion table. The controller 4 manages mapping between each logical address and each physical address with a certain management size unit by using the logical-to-physical address conversion table. A physical address corresponding to a logical address indicates a physical memory location in the NAND flash memory 5 to which data of the logical address is written. The logical-to-physical address conversion table may be loaded from the NAND flash memory 5 to the DRAM 6 when the memory system 3 is powered on.

Data write into one page is executable only once in a single P/E cycle. Thus, the controller 4 writes update data corresponding to a logical address not to an original physical memory location in which previous data corresponding to the logical address is stored but to a different physical memory location. Then, the controller 4 updates the logical-to-physical address conversion table to associate the logical address with the different physical memory location and to invalidate the previous data.

The host I/F 11 is a hardware interface that performs communication between the memory system 3 and the host 2 that is an external device of the memory system 3. The host I/F 11 includes a circuit that receives various commands, for example, input/output (I/O) commands and various control commands from the host 2. The I/O commands may include a write command and a read command. The control commands may include an unmap command (trim command) and a format command. The host I/F 11 includes a circuit that transmits to the host 2 a response or data in accordance with a command.

The DRAM I/F 14 functions as a DRAM control circuit configured to control accesses to the DRAM 6.

The CPU 12 is a processor configured to control the host I/F 11, the NAND I/F 13, the DRAM I/F 14, and the compression device 15. The CPU 12 performs various types of processing by executing the FW loaded in the DRAM 6. That is, the FW is control programs for controlling the operation of the CPU 12. The CPU 12 may perform, in addition to the above described processes of FTL, command processes to process various commands from the host 2. Note that part of or the entire FTL processes and the command processes may be executed by a dedicated hardware in the controller 4.

The compression device 15 is a Huffman encoding unit that encodes data to be written into the NAND flash memory 5 to compress the data. For example, the CPU 12 inputs write data that is received from the host 2 in accordance with reception of a write command, to the compression device 15 as plain text data. The compression device 15 encodes the plain text data input from the CPU 12. In order to compress data, the compression device 15 has, for example, a configuration for implementing dynamic Huffman coding.

The dynamic Huffman coding is a variable length coding for dynamically generating a code table (coding table) by using a frequency of occurrence of each symbol to be encoded. The code table includes information indicating N types of symbols and N variable length codes (code words) that are associated with the N types of symbols, respectively. In the dynamic Huffman coding, a short code word is assigned to a symbol having a high frequency of occurrence, and a long code word is assigned to a symbol having a low frequency of occurrence. The compression device 15 converts an input symbol into a code word in accordance with such assignment. Accordingly, a code word obtained by the conversion is a variable length code. Note that the symbol is, for example, data of a fixed length.

The symbol to be encoded is one of the N types of symbols. Hereinafter, a case where N is 256 will be mainly exemplified.

Each of the 256 types of symbols is, for example, 1-byte data. In this case, the 256 types of symbols correspond to values from 0 to 255, respectively. Any of the values from 0 to 255 that correspond to the 256 types of symbols, respectively, will be also referred to as a symbol number. Note that the number of the types of symbols and the values corresponding to the symbols are merely examples and may be changed in accordance with characteristics of data that includes symbols to be encoded.

The compression device 15 includes a code table generation device 32. The code table generation device 32 is a device that generates a code table for converting a symbol into a variable length code. The code table generation device 32 may be a device included in the compression device 15 or may be part of a circuit that implements the compression device 15. Hereinafter, the code table generation device 32 will be also referred to as a code table generation unit 32.

Here, generation of a code table in a code table generation device 32A according to a comparative example will be described with reference to FIGS. 2 to 6.

FIG. 2 is a block diagram illustrating a configuration of the code table generation device 32A according to the comparative example. The code table generation device 32A includes, for example, a frequency counting unit 321A, a frequency sorting unit 322A, a Huffman tree generation unit 324A, a code length determination unit 325A, and a canonical Huffman unit 326A.

The frequency counting unit 321A generates a frequency table 40A (hereinafter, referred to as a 0-th frequency table 40A) by using input symbols. The 0-th frequency table 40A is a table indicating symbols and frequencies of occurrence of the respective symbols. The frequency counting unit 321A sends the 0-th frequency table 40A to the frequency sorting unit 322A.

The frequency sorting unit 322A sorts entries in the 0-th frequency table 40A in descending order of the frequencies of occurrence. The frequency table obtained by the sorting will be referred to as a first frequency table 41A. The frequency sorting unit 322A sends the first frequency table 41A to the Huffman tree generation unit 324A.

The Huffman tree generation unit 324A generates a Huffman tree by using the first frequency table 41A.

FIG. 3 is a flowchart illustrating an example of the procedure of a Huffman tree generation process executed by the Huffman tree generation unit 324A.

First, the Huffman tree generation unit 324A adds all symbols in the first frequency table 41A that have frequencies of occurrence higher than 0, as leaf nodes on a Huffman tree (step S11). In other words, the Huffman tree generation unit 324A generates a Huffman tree including leaf nodes corresponding to the number of symbols that have frequencies of occurrence higher than 0 in the first frequency table 41A. The number of symbols for which the Huffman tree is to be generated (that is, the number of leaf nodes of the Huffman tree to be generated) by the Huffman tree generation unit 324A is at most N.

Next, the Huffman tree generation unit 324A selects a node A having the lowest frequency of occurrence and a node B having the next lowest frequency of occurrence from all leaf nodes and intermediate nodes having no parent nodes in the Huffman tree (step S12). The Huffman tree generation unit 324A adds an intermediate node having the selected nodes A and B as children to the Huffman tree (step S13). Then, the Huffman tree generation unit 324A sets the sum of the frequencies of occurrence of the nodes A and B as the frequency of occurrence of the added intermediate node (step S14).

The Huffman tree generation unit 324A determines whether two or more leaf and intermediate nodes having no parent nodes are present in all in the Huffman tree (step S15). When two or more leaf and intermediate nodes having no parent nodes present in all in the Huffman tree (Yes in step S15), the process by the Huffman tree generation unit 324A proceeds to step S12. That is, the Huffman tree generation unit 324A further performs a procedure for adding an intermediate node that has leaf and intermediate nodes having no parent nodes as children.

When the number of leaf and intermediate nodes having no parent nodes in the Huffman tree is less than two (No in step S15), the Huffman tree generation unit 324A ends the Huffman tree generation process.

Through the above-described Huffman tree generation process, the Huffman tree generation unit 324A can generate a Huffman tree. The generated Huffman tree includes leaf nodes respectively corresponding to symbols that have frequencies of occurrence higher than 0. The Huffman tree generation unit 324A constructs the Huffman tree bottom-up from a leaf node corresponding to a symbol that has a low frequency of occurrence.

The description returns to FIG. 2. The Huffman tree generation unit 324A sends the generated Huffman tree to the code length determination unit 325A.

The code length determination unit 325A determines a code length of each of the symbols by using the Huffman tree received from the Huffman tree generation unit 324A. A depth of a leaf node starting from a root node (that is, the number of edges traced from the root node to the leaf node) corresponds to a code length of the corresponding symbol. Thus, the code length determination unit 325A can determine the code length of each of the symbols by using the Huffman tree. The code length determination unit 325A sends the determined code length of each of the symbols to the canonical Huffman unit 326A.

The canonical Huffman unit 326A generates a code table by using the code length of each of the symbols received from the code length determination unit 325A. The canonical Huffman unit 326A generates a code table according to, for example, canonical Huffman coding. The canonical Huffman coding is capable of determining a code bit string (variable length code) to be assigned to each of symbols, using only the code lengths of the symbols. A specific example of generating the code table according to the canonical Huffman coding will be described later with reference to FIG. 13.

A specific example in which the code lengths are determined by using the first frequency table 41A will be described with reference to FIGS. 4 to 6.

FIG. 4 illustrates an example of a configuration of the first frequency table 41A that is generated by the frequency counting unit 321A and is sorted by the frequency sorting unit 322A. The first frequency table 41A includes multiple entries that correspond to symbols, respectively. Each of the entries includes, for example, a symbol field and a frequency of occurrence field.

The symbol field indicates a corresponding symbol.

The frequency of occurrence field indicates a frequency of occurrence of the corresponding symbol. More specifically, the frequency of occurrence field indicates, for example, the number of times the corresponding symbol occurs in the input data to be processed.

Note that, hereinafter, a value indicated in the symbol field will be also simply referred to as a symbol. The same will apply to values indicated in other fields of the first frequency table 41A and values indicated in fields of other tables.

In the example illustrated in FIG. 4, a frequency of occurrence of a symbol "a" is 120. A frequency of occurrence of a symbol "b" is 60. A frequency of occurrence of a symbol "c" is 29. A frequency of occurrence of a symbol "d" is 14. A frequency of occurrence of a symbol "e" is four. A frequency of occurrence of each of symbols "f" and "g" is three. A frequency of occurrence of a symbol "h" is two. A frequency of occurrence of each of symbols "i" and "j" is 0.

FIG. 5 illustrates an example of a Huffman tree 50 generated by the Huffman tree generation unit 324A. Here, a case where the Huffman tree generation unit 324A generates the Huffman tree 50 by using the first frequency table 41A illustrated in FIG. 4 will be explained.

First, the Huffman tree generation unit 324A selects, from the frequency table 41, the eight symbols "a", "b", "c", "d", "e", "f", "g", and "h" that have frequencies of occurrence higher than 0. The Huffman tree generation unit 324A generates the Huffman tree 50 including eight leaf nodes 511, 521, 531, 541, 561, 562, 563, and 564 to which the selected eight symbols are assigned, respectively. For each of the leaf nodes, the frequency of occurrence of the corresponding symbol is set.

The Huffman tree generation unit 324A selects the leaf node 564 of the symbol "h" having the lowest frequency of occurrence and the leaf node 563 of the symbol "g" having the next lowest frequency of occurrence from all leaf and intermediate nodes in the Huffman tree 50 that have no parent nodes. Then, the Huffman tree generation unit 324A adds an intermediate node 552 having the selected leaf nodes 564 and 563 as children to the Huffman tree 50. The Huffman tree generation unit 324A sets the sum of the frequency of occurrence of the leaf node 564 and the frequency of occurrence of the leaf node 563 (=2+3=5) as the frequency of occurrence of the intermediate node 552.

Next, the Huffman tree generation unit 324A selects the leaf node 562 of the symbol "f" having the lowest frequency of occurrence and the leaf node 561 of the symbol "e" having the next lowest frequency of occurrence from all leaf and intermediate nodes in the Huffman tree 50 that have no parent nodes. Then, the Huffman tree generation unit 324A adds an intermediate node 551 having the selected leaf nodes 562 and 561 as children to the Huffman tree 50. The Huffman tree generation unit 324A sets the sum of the frequency of occurrence of the leaf node 562 and the frequency of occurrence of the leaf node 561 (=3+4=7) as the frequency of occurrence of the added intermediate node 551.

Next, the Huffman tree generation unit 324A selects the intermediate node 552 having the lowest frequency of occurrence and the intermediate node 551 having the next lowest frequency of occurrence from all leaf and intermediate nodes in the Huffman tree 50 that have no parent nodes. Then, the Huffman tree generation unit 324A adds an intermediate node 542 having the selected intermediate nodes 552 and 551 as children to the Huffman tree 50. The Huffman tree generation unit 324A sets the sum of the frequency of occurrence of the intermediate node 552 and the frequency of occurrence of the intermediate node 551 (=5+7=12) as the frequency of occurrence of the added intermediate node 542.

Similarly, the Huffman tree generation unit 324A repeats the operation of adding an intermediate node until the number of the leaf and intermediate nodes in the Huffman tree 50 that have no parent nodes becomes one or less (that is, until a root node 501 is only obtained as a node having no parent node). As a result, the Huffman tree 50 illustrated in FIG. 5 can be constructed.

The code length determination unit 325A determines code lengths that are associated with the symbols, respectively, by using the constructed Huffman tree 50. Specifically, the code length determination unit 325A determines the code length of each of the eight symbols "a", "b", "c", "d", "e", "f", "g", and "h" by using the constructed Huffman tree 50. The depth of a leaf node corresponding to a symbol starting from the root node 501 indicates the code length of the symbol. For example, the depth of the leaf node 511 of the symbol "a" starting from the root node 501 is one. Thus, the code length of the symbol "a" is 1 bit. Further, for example, the depth of the leaf node 564 of the symbol "h" starting from the root node 501 is six. Thus, the code length of the symbol "h" is 6 bits.

Figure 6:
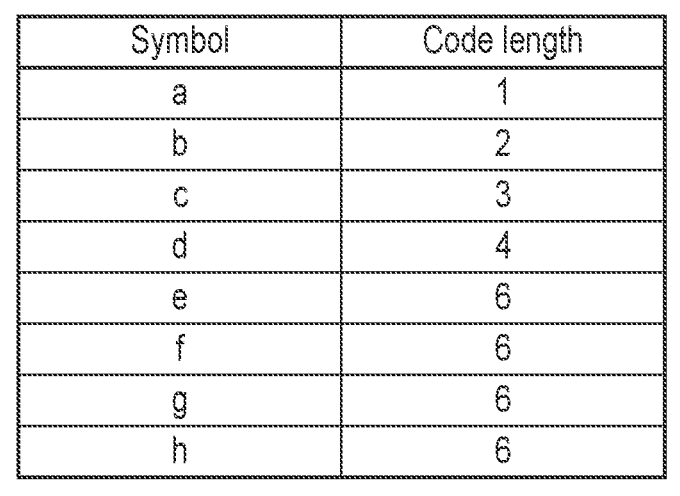

FIG. 6 illustrates an example of the code length of each symbol determined by the code length determination unit 325A using the Huffman tree 50 illustrated in FIG. 5.

Specifically, the code length of the symbol "a" is 1 bit. The code length of the symbol "b" is 2 bits. The code length of the symbol "c" is 3 bits. The code length of the symbol "d" is 4 bits. Further, the code length of each of the symbols "e", "f", "g", and "h" is 6 bits.

As described above, in the code table generation device 32A according to the comparative example, processing of constructing the Huffman tree 50 and determining the code length of each symbol requires a processing amount proportional to the number of types of symbols that have appeared. Thus, in the code table generation device 32A according to the comparative example, in a case where there are many types of symbols that have appeared, it takes a lot of time to perform the code table generation process, or a circuit scale (for example, the number of gates) of the code table generation device 32A increases in order to complete generation of the code table within a specific time period.

Thus, in the code table generation device 32 according to the present embodiment, a processing amount required for constructing a Huffman tree is reduced. Specifically, the code table generation device 32 divides N types of symbols into top K symbols in descending order of the frequencies of occurrence and the remaining (N-K) symbols, regards the (N-K) symbols as a single leaf node or M leaf nodes on the Huffman tree, and performs construction processing of the Huffman tree. Note that K is an integer equal to or greater than one and less than N. Thus, (N-K) is an integer equal to or greater than one and less than N.

M is an integer smaller than (N-K). As a result, in the code table generation device 32, the number of leaf nodes of the Huffman tree to be constructed is reduced, thus, a processing amount required for constructing the Huffman tree can be reduced.

Figure 7:
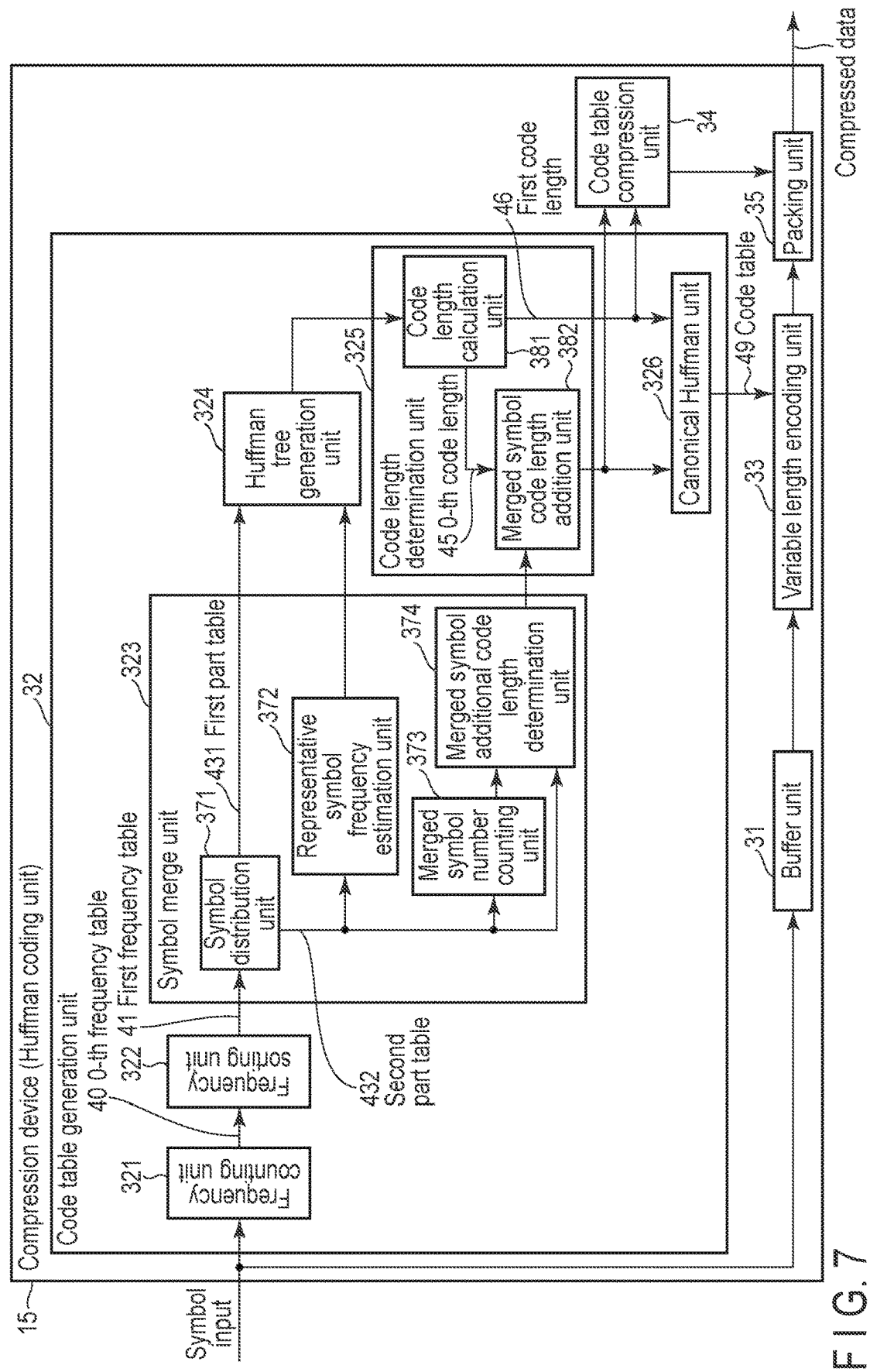
FIG. 7 is a block diagram illustrating an example of a configuration of a compression device that includes the code table generation device according to the first embodiment.

FIG. 7 illustrates an example of a configuration of the compression device 15. The compression device includes, for example, a buffer unit 31, a code table generation unit 32 (code table generation device 32), a variable length encoding unit 33, a code table compression unit 34, and a packing unit 35.

The buffer unit 31 stores (buffers) symbols that are input to the compression device 15. The buffer unit 31 delays the stored symbols until, for example, a specific timing and then transmits the symbols to the variable length encoding unit 33.

The code table generation unit 32 generates a code table 49 by using the symbols input to the compression device 15. The code table 49 includes information indicating symbols and variable length codes (that is, code bit strings) that are associated with the symbols, respectively.

More specifically, the code table generation unit 32 generates the code table 49 on the basis of frequencies of occurrence of symbols that are included in input data of a specific unit. The specific unit may be a unit of a specific data amount or may be a specific group such as a file. In a case where the unit is a specific group, the code table generation unit 32 detects data indicating the termination of the input data to recognize the input data of the specific unit.

The code table generation unit 32 transmits the generated code table 49 to the variable length encoding unit 33. The code table generation unit 32 transmits, to the code table compression unit 34, lengths of the variable length codes (that is, code lengths) that are assigned to the symbols, respectively, indicated in the code table 49.

The code table compression unit 34 compresses the code table 49. Specifically, the code table compression unit 34 performs a compression process on the code lengths received from the code table generation unit 32. The compression process performed on the code lengths is, for example, a process of arranging the code lengths in a specific symbol order, performing run-length encoding on the arranged code lengths, and further performing Huffman encoding on the result, as indicated in the DEFLATE format (RFC 1951). The specific symbol order is, for example, an order conforming to the corresponding symbols in an alphabetical order. In other words, the code lengths arranged in the specific symbol order is, for example, code lengths arranged so as to correspond to the symbols, respectively, that are arranged in the alphabetical order. The code table compression unit 34 sends the data (compressed code table 49) obtained by the compression processing to the packing unit 35.

The variable length encoding unit 33 converts the symbols sent from the buffer unit 31 into the variable length codes (code bit strings) by using the code table 49 sent from the code table generation unit 32. The variable length encoding unit 33 sends the variable length codes obtained by the conversion to the packing unit 35.

The packing unit 35 sequentially concatenates one or more variable length codes output from the variable length encoding unit 33 and outputs the concatenated variable length codes as compressed data (compressed stream) for each specific data size. The specific data size is, for example, 64 bits. Further, the packing unit 35 inserts the compressed code table 49 output from the code table compression unit 34 as a header of the compressed data. The compressed code table 49 is used to restore the code table 49 (decoding table) when the compressed data is decoded in a decompressor.

With the above configuration, the compression device 15 can perform dynamic Huffman coding on the input symbols to convert the input symbols into the variable length codes. For example, in a case where the input symbols are data requested to be written into the NAND flash memory 5 by the host 2, the CPU 12 writes compressed data that includes one or more variable length codes and the compressed code table 49, into the NAND flash memory 5 via the NAND I/F 13.

The controller 4 may further include an ECC encoder and an ECC decoder. In this case, the ECC encoder generates a parity for error correction (ECC parity) for the compressed data output from the packing unit 35 and generates a code word having the generated ECC parity and the compressed data. The CPU 12 is configured to write the code word into the NAND flash memory 5 via the NAND I/F 13. In other words, the CPU 12 is configured to write data based on the compressed data output from the compression device 15 into the NAND flash memory 5 via the NAND I/F 13. Further, for example, in a case where a read command is received from the host 2 via the host I/F 11, the CPU 12 reads data based on the read command from the NAND flash memory 5 via the NAND I/F 13. The ECC decoder executes error correction processing on the read data. The read data on which the error correction processing has been executed is input to the decompressor by the CPU 12 as compressed data, and the decompressor decompresses the input compressed data. The CPU 12 transmits the decompressed data to the host 2 in response to the read command from the host 2. In other words, in response to the read command from the host 2, the CPU 12 is configured to decompress data based on data read from the NAND flash memory 5 and transmit the decompressed data to the host 2.

Part or all of the compression device 15 may be implemented as a hardware such as a circuit or may be implemented as programs (i.e., software) executed by at least one processor.

Next, a specific configuration of the code table generation unit 32 will be described. The code table generation unit 32 includes, for example, a frequency counting unit 321, a frequency sorting unit 322, a symbol merge unit 323, a Huffman tree generation unit 324, a code length determination unit 325, and a canonical Huffman unit 326.

The frequency counting unit 321 generates a frequency table 40 (hereinafter, referred to as a 0-th frequency table 40) based on a frequency of occurrence of the input symbols for each symbol. For example, the frequency counting unit 321 counts the number of occurrences of the input symbols for each symbol, thereby generating the 0-th frequency table 40. For example, the frequency counting unit 321 generates the 0-th frequency table 40 every time 4096 symbols are input. The 0-th frequency table 40 is a table indicating symbols and frequencies of occurrence (for example, the number of occurrence) that are associated with the symbols, respectively. The frequency counting unit 321 sends the 0-th frequency table 40 to the frequency sorting unit 322.

The frequency sorting unit 322 sorts the entries in the 0-th frequency table 40 in descending order of the frequencies of occurrence. The frequency table obtained by the sorting will be referred to as a first frequency table 41. The frequency sorting unit 322 sends the first frequency table 41 to the symbol merge unit 323.

FIG. 8 illustrates an example of the 0-th frequency table 40 generated by the frequency counting unit 321. The 0-th frequency table 40 includes N entries that correspond to N types of symbols, respectively. Indexes from 0 to N−1 are assigned to the N entries, respectively, in order from the head. Thus, each of the N entries is identifiable by the index. In the example illustrated in FIG. 8, N is 256. Each entry includes a symbol number field and a frequency of occurrence field.

In the entry corresponding to a certain symbol, the symbol number field indicates a symbol number corresponding to the symbol. The frequency of occurrence field indicates a frequency (for example, the number of times) at which the corresponding symbol occurs in one or more symbols included in the input data.

In the 0-th frequency table 40 illustrated in FIG. 8, for example, an entry with the index 0 indicates that the frequency of occurrence of a symbol with a symbol number 0 is three. For example, an entry with the index 1 indicates that a frequency of occurrence of a symbol with a symbol number 1 is 16. Furthermore, for example, an entry with the index 253 indicates that the frequency of occurrence of a symbol with a symbol number 253 is 30.

FIG. 9 illustrates an example of the first frequency table 41 acquired by the frequency sorting unit 322. The first frequency table 41 is a table in which the 256 entries in the 0-th frequency table 40 are arranged in descending order of the frequencies of occurrence. Indexes from 0 to 255 are assigned to the 256 entries in the first frequency table 41, respectively, in order from the head.

In the first frequency table 41 illustrated in FIG. 9, for example, an entry with the index 0 indicates that the frequency of occurrence of a symbol with a symbol number 64 is 50. For example, an entry with the index 1 indicates that the frequency of occurrence of the symbol with the symbol number 253 is 30. Furthermore, for example, an entry with the index 255 indicates that the frequency of occurrence of a symbol with a symbol number 8 is 0.

As described above, in the first frequency table 41, the 256 entries are arranged in descending order of the frequencies of occurrence.

The description returns to FIG. 7.

The symbol merge unit 323 performs processing for regarding one or more symbols having low frequencies of occurrence among all the symbols (that is, N symbols) in the first frequency table 41 as one symbol (hereinafter, referred to as a representative symbol) while a Huffman tree is constructed. The symbol merge unit 323 includes, for example, a symbol distribution unit 371, a representative symbol frequency estimation unit 372, a merged symbol number counting unit 373, and a merged symbol additional code length determination unit 374.

The symbol distribution unit 371 divides the first frequency table 41 into a first part table 431 and a second part table 432. The first part table 431 includes top K entries in descending order of the frequencies of occurrence among the N entries included in the first frequency table 41. The K entries are entries of K symbols having high frequencies of occurrence. The K symbols having high frequencies of occurrence are also referred to as high-order symbols. The second part table 432 includes the remaining (N-K) entries that are obtained by excluding the top K entries from the N entries included in the first frequency table 41. The (N-K) entries are entries of (N-K) symbols having low frequencies of occurrence. The (N-K) entries are more likely to include a symbol whose frequency of occurrence is 0 than the high-order K entries. The (N-K) symbols having low frequencies of occurrence are also referred to as low-order symbols. The (N-K) low-order symbols are considered as one representative symbol when a Huffman tree is constructed. In other words, the representative symbol is a symbol representing the (N-K) low-order symbols.

The symbol distribution unit 371 sends the first part table 431 to the Huffman tree generation unit 324. The symbol distribution unit 371 sends the second part table 432 to the representative symbol frequency estimation unit 372, the merged symbol number counting unit 373, and the merged symbol additional code length determination unit 374.

FIG. 10 illustrates (a) an example of the first frequency table 41, and (b) an example of the first part table 431 and (c) an example of the second part table 432 that are obtained by dividing the first frequency table 41. In the example illustrated in FIG. 10, N is 256 and K is 32.

The first frequency table 41 illustrated in FIG. 10(*a*) is a table in which the N entries are arranged in descending order of the frequencies of occurrence, similarly to the first frequency table 41 illustrated in FIG. 9. The first frequency table 41 is divided into the first part table 431 and the second part table 432.

As illustrated in FIG. 10(*b*), the first part table 431 includes top K entries (that is, K entries from the head) among the entries included in the first frequency table 41. Indexes from 0 to K−1 are respectively assigned to the K entries in the first part table 431 in order from the head.

As illustrated in FIG. 10(*c*), the second part table 432 includes the remaining (N-K) entries (224 entries in FIG. 10(*c*)) that are obtained by excluding the top K entries from the entries included in the first frequency table 41. Indexes from 0 to N-K−1 are respectively assigned to the (N-K) entries in the second part table 432 in order from the head.

The description returns to FIG. 7.

In order that the (N-K) low-order symbols included in the second part table 432 are regarded as one representative symbol while a Huffman tree is constructed, the representative symbol frequency estimation unit 372 estimates a frequency of occurrence of the representative symbol. The representative symbol frequency estimation unit 372 estimates the frequency of occurrence of the representative symbol by, for example, estimating the sum of the frequencies of occurrence of (N-K) low-order symbols.

Here, an example of calculating an estimated value of the sum of the frequencies of occurrence of (N-K) low-order symbols in a case where N is 256 and K is 32 will be described. The representative symbol frequency estimation unit 372 calculates an estimated value S of the sum of the frequencies of occurrence of the low-order symbols by the following expression (1) using a frequency of occurrence F(i) of a symbol indicated in an entry in the second part table 432 that is specified by an index i.

$$S = \sum_{k=0}^{13} \frac{F(k \times 16) + F(k \times 16 + 15)}{2} \times 16 \qquad \text{(Expression 1)}$$

In calculation according to the expression (1), the 224 entries included in the second part table 432 are divided for every 16 indexes from the head, and 14 ranges (hereinafter, referred to as index ranges) are set. A k-th index range from the head among the 14 index ranges is referred to as a k-th index range. Note that k is any value from 0 to 13.

The representative symbol frequency estimation unit 372 calculates an estimated value of the frequency of occurrence for each of the 0-th to 13-th index ranges. Specifically, the representative symbol frequency estimation unit 372 multiplies an average value of the frequency of occurrence F (k×16) indicated in the first entry of the k-th index range and the frequency of occurrence F (k×16+15) indicated in the last entry of the k-th index range by the number of symbols in one index range (here, 16), thereby calculating an estimated value of the frequency of occurrence corresponding to the k-th index range. Then, the representative symbol frequency estimation unit 372 calculates the sum of the estimated values of the frequencies of occurrence that correspond to the 0-th to 13-th index ranges, respectively, thereby obtaining an estimated value S of the sum of the frequencies of occurrence of the lower-order symbols.

In the calculation according to the expression (1), the number of times of addition required to calculate the estimated value S is reduced by assuming that the frequency of occurrence corresponding to the index changes linearly from the first entry to the last entry in each index range. Note that the calculation method of the estimated value S is an example, and other methods may be used. For example, the number of index ranges set by dividing the 224 entries included in the second part table 432 may be appropriately changed in consideration of a calculation amount required to calculate the estimated value S and accuracy of the estimated value S to be calculated.

The representative symbol frequency estimation unit 372 sends the estimated value S of the sum of the frequencies of occurrence of the lower-order symbols to the Huffman tree generation unit 324 as a frequency of occurrence of the representative symbol.

The Huffman tree generation unit 324 generates a Huffman tree by using the first part table 431 and the frequency of occurrence of the representative symbol. Specifically, the Huffman tree generation unit 324 arranges, as leaf nodes, symbols each having a frequency of occurrence higher than 0 among the K symbols in the first part table 431 and the representative symbol and then performs a Huffman tree generation process. This Huffman tree generation process is similar to the Huffman tree generation process described above with reference to FIG. 3. Specifically, this Huffman tree generation process is a process in which all symbols each having a frequency of occurrence higher than 0 in the first frequency table 41A in step S11 are replaced with the symbols each having a frequency of occurrence higher than 0 among the K symbols in the first part table 431 and the representative symbol in the Huffman tree generation process described above with reference to FIG. 3. The Huffman tree generation unit 324 sends the generated Huffman tree to the code length determination unit 325.

Figure 11:
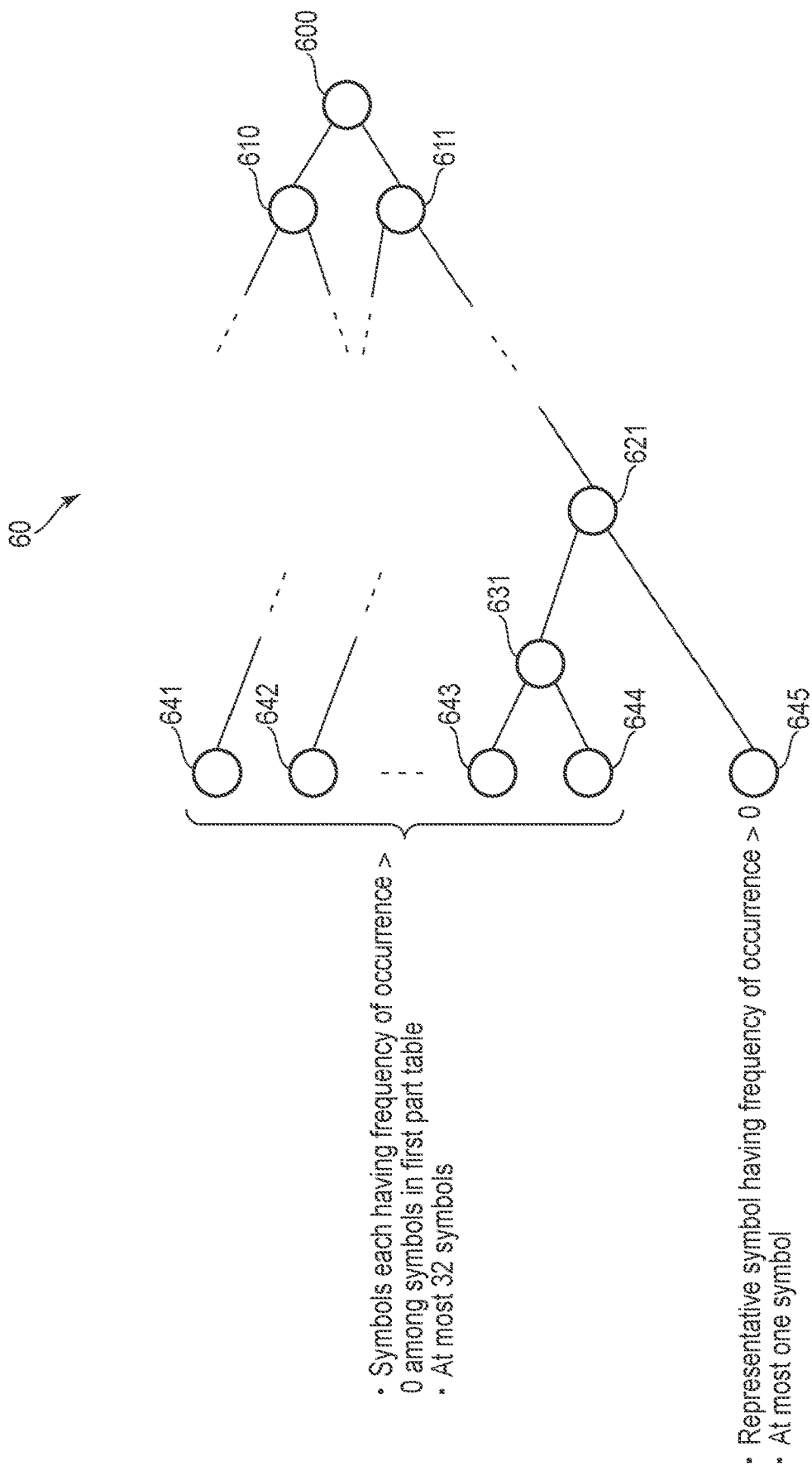
FIG. 11 is a view illustrating an example of a Huffman tree constructed in the code table generation device according to the first embodiment.

FIG. 11 illustrates an example of the Huffman tree 60 generated by the Huffman tree generation unit 324. The Huffman tree 60 includes a root node 600, intermediate nodes 610, 611, 621, and 631, first type leaf nodes 641, 642, 643, and 644, and a second type leaf node 645.

Each of the first type leaf nodes 641, 642, 643, and 644 corresponds to a symbol having a frequency of occurrence higher than 0 among the symbols included in the first part table 431. The number of the first type leaf nodes is at most K.

The second type leaf node 645 corresponds to the representative symbol whose frequency of occurrence is higher than 0. The number of the second type leaf nodes is at most one.

Thus, the number of symbols on which the Huffman tree generation is performed (that is, the number of leaf nodes of the Huffman tree to be generated) by the Huffman tree generation unit 324 is at most (K+1). In contrast, as described above, the number of symbols on which the Huffman tree generation is performed by the Huffman tree generation unit 324A of the code table generation device 32A according to the comparative example is at most N. For example, in a case where N is 256 and K is 32, the number of symbols on which the Huffman tree generation is performed by the Huffman tree generation unit 324 is greatly reduced from at most 256 to at most 33 (=32+1) in the code table generation unit 32 of the present embodiment as compared with the Huffman tree generation unit 324A of the comparative example. Accordingly, in the code table generation device 32 of the present embodiment, it is possible to reduce a time period required for the code table generation process or to reduce a circuit scale (for example, the number of gates) for completing code table generation within a specific time period.

However, as a result of all the symbols included in the second part table 432 being treated as one representative symbol, there is a concern that coding efficiency of dynamic Huffman coding is lowered. In order to address the concern, K high-order symbols that are included in the first part table 431 and account for most of the frequencies of occurrence are treated as K symbols (that is, K leaf nodes) also on the Huffman tree. Accordingly, accuracy of dynamic Huffman coding is secured. In other words, the number K of symbols included in the first part table 431 is reduced within a range in which accuracy of the dynamic Huffman coding can be secured. In addition, the (N-K) lower-order symbols included in the second part table 432 often have low frequencies of occurrence. Thus, even if non-optimal code lengths are set for the lower-order symbols, influence on the coding efficiency is small.

Therefore, the code table generation device 32 of the present embodiment can reduce a time period required for the code table generation process or can reduce a circuit scale for completing the code table generation within a specific time period while keeping decrease in the coding efficiency within a practically acceptable range.

The merged symbol number counting unit 373 counts the number of symbols C in the second part table 432 that have frequencies of occurrence higher than 0, respectively. Note that C is an integer equal to or greater than 0. If the second part table 432 does not include a symbol whose frequency of occurrence is higher than 0, C is 0. A symbol whose frequency of occurrence is higher than 0 included in the second part table 432 will be referred to as a merged symbol. The merged symbol is a symbol to which a variable length code needs to be assigned among the symbols included in the second part table 432. The number of merged symbols C counted by the merged symbol number counting unit 373 is the number of merged symbols that are represented by the representative symbol. The merged symbol number counting unit 373 sends the number of merged symbols C to the merged symbol additional code length determination unit 374.

The merged symbol additional code length determination unit 374 determines, for each merged symbol, a code length (hereinafter, referred to as an additional code length) to be added to the code length of the representative symbol by using a subtree based on the second part table 432 and the number of merged symbols C. The merged symbol additional code length determination unit 374 sends the additional code length for each merged symbol to the code length determination unit 325.

A code length of each merged symbol is obtained by adding the additional code length to the code length of the representative symbol. This is equivalent to determining a subtree having leaf nodes that correspond the merged symbols, respectively, and determining a position on the Huffman tree 60 for the root node of the subtree by the Huffman tree generation process.

Figure 12:
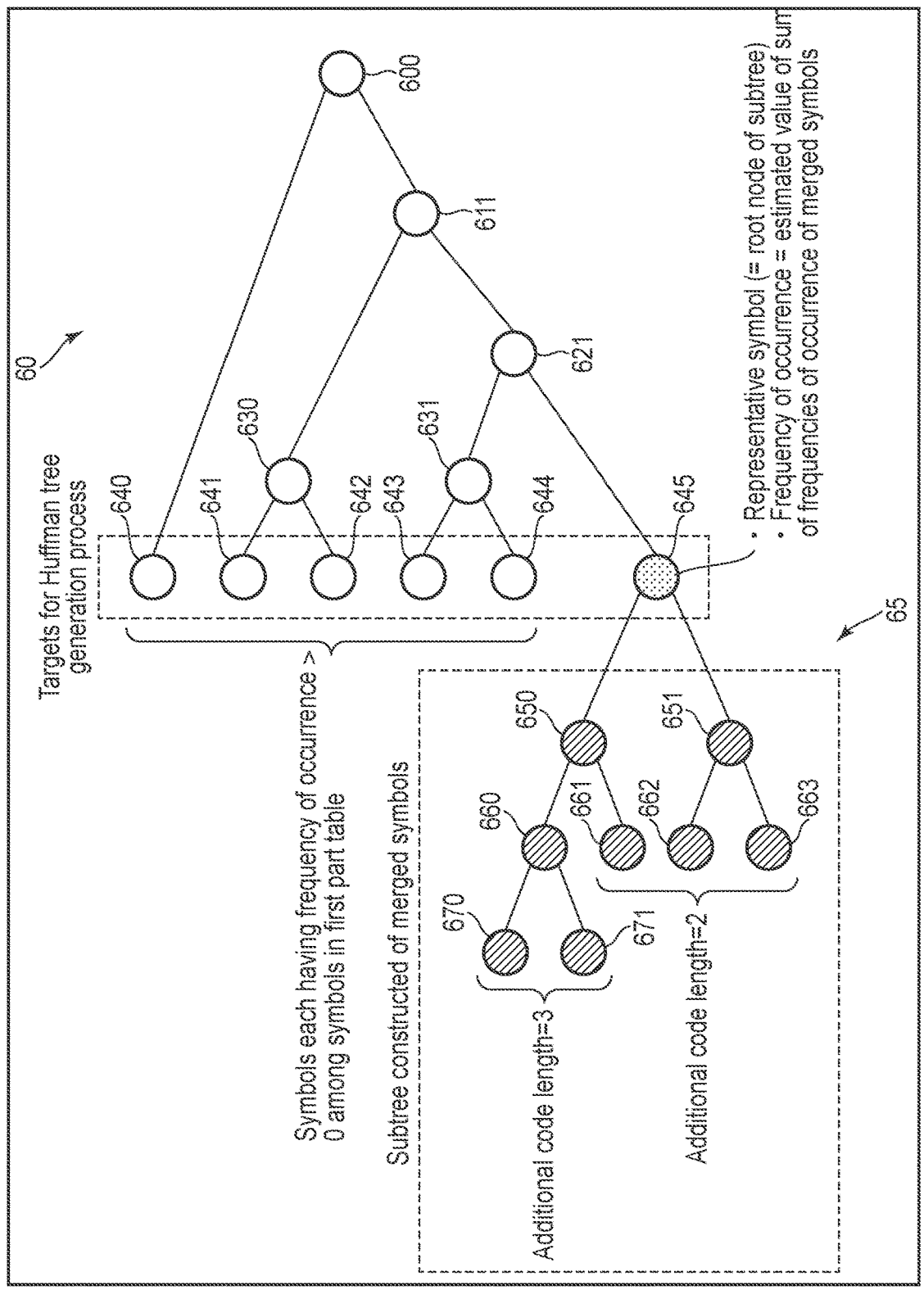
FIG. 12 is a view illustrating an example of a subtree of merged symbols that is used in the code table generation device according to the first embodiment.

FIG. 12 illustrates an example of a subtree 65 of merged symbols that is used by the merged symbol additional code length determination unit 374. The subtree 65 is a binary tree whose root node is the leaf node 645 of the Huffman tree 60. Here, a case where the number of merged symbols C is five will be exemplified.

The Huffman tree 60 includes the root node 600, the intermediate nodes 611, 621, 630, and 631, the first type leaf nodes 640, 641, 642, 643, and 644, and the second type leaf node 645, similar to the Huffman tree 60 described above with reference to FIG. 11.

Each of the first type leaf nodes 641, 642, 643, and 644 corresponds to a symbol having a frequency of occurrence higher than 0 among the symbols included in the first part table 431.

The second type leaf node 645 corresponds to a representative symbol whose frequency of occurrence is higher than 0. The second type leaf node 645 is the root node of the subtree 65. The frequency of occurrence associated with the second type leaf node 645 is the estimated value S of the sum of the frequencies of occurrence of the merged symbols.

The subtree 65 includes intermediate nodes 650, 651, and 660, and leaf nodes 661, 662, 663, 670, and 671 and includes the leaf node 645 of Huffman tree 60 as the root node. The leaf nodes 661, 662, 663, 670, and 671 correspond to five merged symbols, respectively.

Thus, a code length of each merged symbol is determined by adding, as the additional code length, a depth (the number of edges) of each of the leaf nodes 661, 662, 663, 670, and 671 starting from the root node (that is, the leaf node 645) in the subtree 65 to a code length of the representative symbol corresponding to the leaf node 645.

From the viewpoint of reduction in a processing amount, it is desirable that the subtree 65 including C leaf nodes that correspond to C merged symbols, respectively, has a structure in which the additional code length for each merged symbol can be easily obtained using the number of merged symbols C.

Thus, the merged symbol additional code length determination unit 374 adopts a balanced binary tree as the subtree 65. Note that a structure other than the balanced binary tree may be used as the subtree 65. The balanced binary tree is a binary tree in which, for all leaf nodes, a difference in a depth between the leaf nodes is at most one. The merged symbol additional code length determination unit 374 determines the additional code length for each merged symbol by the following procedure (A1) and (A2).

(A1) Calculate a minimum integer D that satisfies $2^D \geq C$.
(A2) Set additional code lengths of $(2^D - C)$ merged symbols in ascending order of the indexes on the second part table 432 (that is, in descending order of the frequencies of occurrence) among the C merged symbols to (D-1) bits, and set additional code lengths of the remaining $(2C - 2^D)$ merged symbols to D bits.

In the example illustrated in FIG. 12, C=5. Thus, in a case where D is calculated according to the above procedure, the merged symbol additional code length determination unit 374 calculates D=3 since $2^3 > 5$. Then, the merged symbol additional code length determination unit 374 sets the additional code lengths of three ($=2^3 - 5$) merged symbols in ascending order of the indexes on the second part table 432 among the five merged symbols (corresponding to the leaf nodes 661, 662, and 663) to 2 ($=3-1$) bits. In addition, the merged symbol additional code length determination unit 374 sets additional code lengths of the remaining two ($=2 \times 5 - 2^3$) merged symbols (corresponding to the leaf nodes 670 and 671) to 3 bits.

The description returns to FIG. 7.

By using the Huffman tree 60 generated by the Huffman tree generation unit 324 and the additional code length for each merged symbol determined by the merged symbol additional code length determination unit 374, the code length determination unit 325 determines a code length of each symbol whose frequency of occurrence is higher than 0 among the K high-order symbols included in the first part table 431, and a code length of each of the C merged symbols. The code length determination unit 325 includes, for example, a code length calculation unit 381 and a merged symbol code length addition unit 382. Hereinafter, in order to make the description easy to understand, a case where the frequencies of occurrence of all the K high-order symbols are higher than 0 and C is equal to or greater than one will be exemplified. Note that actually, the K high-order symbols may include a symbol whose frequency of occurrence is 0, and C may be 0. In this case, the code length determination unit 325 does not calculate a code length of a symbol whose frequency of occurrence is 0 among the K high-order symbols.

The code length calculation unit 381 determines a code length of each of the K high-order symbols and a code length of the representative symbol by using the Huffman tree 60 generated by the Huffman tree generation unit 324. Specifically, the code length calculation unit 381 determines the number of edges passing from a leaf node corresponding to each of the symbols, which include the K high-order symbols and the representative symbol, to the root node 600 by tracing edges in the Huffman tree 60, as the code length of the symbol. In the example illustrated in FIG. 12, for example, the code length of the high-order symbol corresponding to the leaf node 640 is one. For example, the code length of the high-order symbol corresponding to the leaf node 643 is four. Furthermore, for example, the code length of the representative symbol corresponding to the leaf node 645 is three.

The code length calculation unit 381 sends the determined code length 45 (hereinafter, referred to as a 0-th code length 45) of the representative symbol to the merged symbol code length addition unit 382. The code length calculation unit 381 sends the determined K code lengths 46 (hereinafter, referred to as first code lengths 46) corresponding to the K high-order symbols to the code table compression unit 34 and the canonical Huffman unit 326. For the K high-order symbols, the first code lengths 46 determined using the Huffman tree 60 are used as they are by the code table compression unit 34 and the canonical Huffman unit 326.

The merged symbol code length addition unit 382 determines a code length (hereinafter, also referred to as a merged symbol code length) of each of the C merged symbols by using the 0-th code length 45 and the C additional code lengths corresponding to the respective C merged symbols. Specifically, for each of the C merged symbols, the merged symbol code length addition unit 382 adds the additional code length corresponding to the merged symbol to the 0-th code length 45, thereby determining the code length of the merged symbol. The merged symbol code length addition unit 382 sends the C merged symbol code lengths to the code table compression unit 34 and the canonical Huffman unit 326.

The canonical Huffman unit 326 generates a code table 49 according to a canonical Huffman coding by using the K first code lengths 46 sent by the code length calculation unit 381 and the C merged symbol code lengths sent by the merged symbol code length addition unit 382. The canonical Huffman coding is capable of determining a code bit string (variable length code) to be assigned to each of symbols by using only code lengths of the symbols. In the canonical Huffman coding, a code bit string is assigned to each symbol in accordance with the following rules (B1) and (B2).

(B1) A code bit string to be assigned to a symbol having a short code length precedes, in dictionary order, a code bit string to be assigned to a symbol having a long code length.

(B2) In two symbols whose code lengths are equal, a code bit string assigned to one of the two symbols preceding in symbol order precedes, in the dictionary order, a code bit string assigned to the other of the two symbols succeeding in the symbol order.

For example, in order to determine the dictionary order of the code bit strings, the dictionary order of bit values "0" and "1" is defined as the order of "0" and "1". In this case, each bit value included in a code bit string and each bit value included in another code bit string are compared in order from the higher bit to determine the order (bit order) of the corresponding bit values, thereby determining the dictionary order of the code bit strings.

More specifically, for example, "1'b0", "2'b10", "3'b110", and "3'b111" are four code bit strings arranged in the dictionary order. Note that a data string including at least one bit value of 0 or 1 subsequent to "X'b" indicates a bit data string of X bits. Thus, in these four code bit strings, the 1-bit code bit string "1'b0" precedes the 2-bit code bit string "2'b10" in the bit order of the most significant bits. The 2-bit code bit string "2'b10" precedes the 3-bit code bit string "3'b110" in the bit order of the next most significant bits. The 3-bit code bit string "3'b110" precedes the 3-bit code bit string "3'b111" in the bit order of the least significant bits.

FIG. 13 illustrates an example of a pseudo-program for assigning a code bit string to a symbol by the canonical Huffman unit 326. In the pseudo-program, a variable "code" is used to calculate a code bit string to be assigned to a symbol.

First, the canonical Huffman unit 326 sets the variable "code" to 0 (=1'b0). When code bit strings are to be assigned to symbols, respectively, the number of bits of the variable "code" depends upon a minimum code length of code lengths that are associated with the symbols, respectively.

Next, in one while loop, the canonical Huffman unit 326 determines a code bit string to be assigned to one symbol in ascending code length order and in specific symbol order in the case of the same code length.

For example, in a first while loop, the canonical Huffman unit 326 selects, as a target to which a code bit string is assigned, a symbol that has the shortest code length and precedes, in specific symbol order, another symbol having the same code length, if any.

Then, the canonical Huffman unit 326 assigns the variable "code" (=1'b0) as a code bit string of the selected symbol. As described above, the number of bits of the variable "code" assigned first depends on the minimum code length. In this example, it is assumed that the minimum code length is one. Then, the canonical Huffman unit 326 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 2'b10 obtained by shifting 1'b1 that is a value obtained by adding one to the variable "code" (=1'b0), to the left by 1 bit is set as the variable "code".

Furthermore, for example, in a second while loop, the canonical Huffman unit 326 selects, as a target to which a code bit string is to be assigned, a symbol that has the second shortest code length, or a symbol has the shortest code length and is the second in the specific symbol order when there is another symbol having the same code length. The canonical Huffman unit 326 assigns the variable "code" (=2'b10) as a code bit string of the selected symbol. Then, the canonical Huffman unit 326 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 3'b110 obtained by shifting 2'b11 that is a value obtained by adding one to the variable "code" (=2'b10), to the left by 1 bit is set as the code.

By performing such loop processing, the canonical Huffman unit 326 can assign a code bit string to each of the symbols by using the relationship in order among the symbols and the code lengths corresponding to the respective symbols. In other words, the canonical Huffman unit 326 can uniquely determine a code bit string to be assigned to each of the symbols by determining the relationship in order among the symbols and the code lengths of the respective symbols.

As described above, the code table compression unit 34 performs a compression process on the K first code lengths 46 corresponding to the K high-order symbols and the C merged symbol code lengths corresponding to the C merged symbols. For example, the code table compression unit 34 sorts the K first code lengths 46 corresponding to the K high-order symbols and the C merged symbol code lengths corresponding to the C merged symbols in specific symbol order, performs run-length encoding on the sorted code lengths, and performs Huffman encoding on the result of the run-length encoding. Accordingly, the compressed code table 49 is acquired.

As described above, the packing unit 35 sequentially concatenates one or more variable length codes output from the variable length encoding unit 33 and outputs the concatenated one or more variable length codes as compressed data for each specific data size. Further, the packing unit 35 inserts the compressed code table 49 as a header of the compressed data. In the canonical Huffman coding, a code bit string to be assigned to each of symbols can be uniquely determined by determining the relationship in order among the symbols and code lengths of the respective symbols. Thus, the code table (decoding table) to be used for decoding in the decompressor can be restored from the compressed code table 49. By encoding the code lengths in the code table compression unit 34, a code amount overhead of the compressed data can be greatly reduced as compared with a case of encoding the code bit strings themselves.

FIG. 14 is a flowchart illustrating an example of the procedure of an encoding process executed in the compression device 15. The encoding process is a process of converting each of one or more symbols that are included in data (input data) input to the compression device 15, into a variable length code and acquiring compressed data. The encoding process is executed, for example, in response to input of data of a specific unit to the compression device 15.

First, the buffer unit 31 stores the one or more symbols included in the input data (step S101). The code table generation unit 32 performs a code table generation process (step S102). The code table generation process is a process of generating a code table 49 on the basis of frequencies of occurrence of the one or more symbols in the input data for each symbol. An example of specific procedure of the code table generation process will be described later with reference to a flowchart of FIG. 15. Note that the procedure in step S101 and the procedure in step S102 may be performed in parallel.

Next, the variable length encoding unit 33 converts each of the one or more symbols stored in the buffer unit 31 into a variable length code by using the generated code table 49 (step S103). Further, the code table compression unit 34 compresses the code table 49 (step S104). Specifically, the code table compression unit 34 performs a compression process on code lengths that are associated with symbols, respectively. As described above, the compression process performed on the code lengths is, for example, a process of sorting the code lengths in the specific symbol order, performing run-length encoding on the sorted code lengths, and performing Huffman encoding on the result. Note that the procedure in step S103 and the procedure in step S104 may be performed in parallel.

The packing unit 35 outputs compressed data that includes the compressed code table 49 and the concatenated one or more variable length codes (step S105) and ends the encoding process.

As described above, the compression device 15 can convert each of the one or more symbols included in the input data into the variable length code and acquire the compressed data. In a case where the input data is, for example, data requested to be written into the NAND flash memory 5 by the host 2, the CPU 12 can write the compressed data obtained by compressing the input data into the NAND flash memory 5 via the NAND I/F 13.

Figure 15:
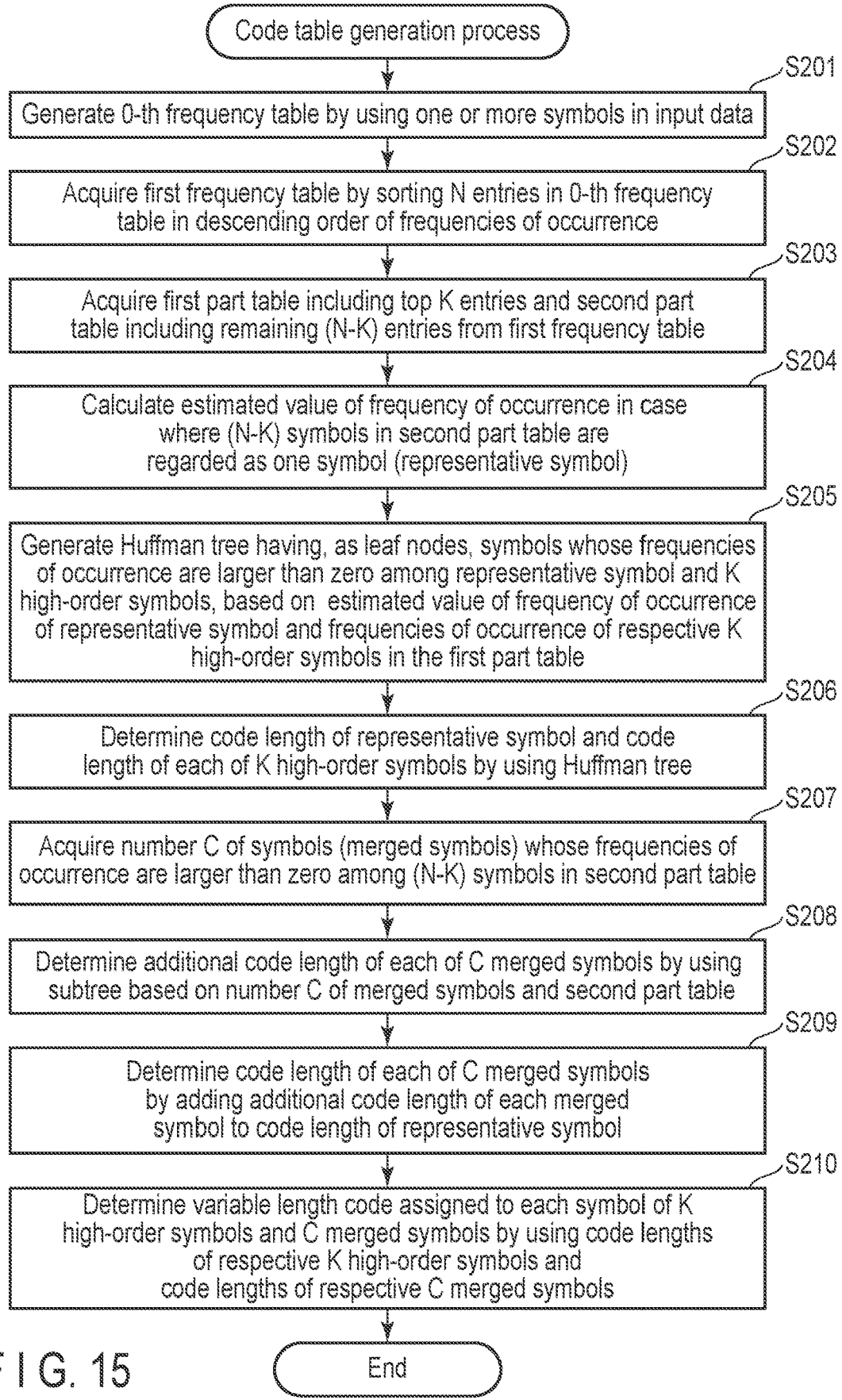
FIG. 15 is a flowchart illustrating an example of the procedure of a code table generation process executed in the code table generation device according to the first embodiment.

FIG. 15 is a flowchart illustrating an example of the procedure of a code table generation process executed in the code table generation unit 32. The code table generation process corresponds to the procedure in step S102 of the encoding process described above with reference to FIG. 14. The input data to the compression device 15 is input to the code table generation unit 32.

First, the frequency counting unit 321 of the code table generation unit 32 generates the 0-th frequency table 40 by using one or more symbols included in the input data (step S201). The frequency sorting unit 322 sorts N entries included in the 0-th frequency table in descending order of the frequencies of occurrence to acquire the first frequency table 41 (step S202). Then, the symbol distribution unit 371 acquires, from the first frequency table 41, the first part table 431 including the top K entries and the second part table 432 including the remaining (N-K) entries (step S203). The first part table 431 is sent to the Huffman tree generation unit 324. The second part table 432 is sent to the representative symbol frequency estimation unit 372, the merged symbol number counting unit 373, and the merged symbol additional code length determination unit 374.

The representative symbol frequency estimation unit 372 calculates an estimated value of a frequency of occurrence in a case where the (N-K) symbols in the second part table 432 are regarded as one symbol (representative symbol) (step S204). On the basis of the estimated value of the frequency of occurrence of the representative symbol and the frequencies of occurrence of the K high-order symbols in the first part table 431, the Huffman tree generation unit 324 generates the Huffman tree 60 that has, as leaf nodes, symbols each having a frequency of occurrence higher than 0 among the representative symbol and the K high-order symbols (step S205). Here, it is assumed that the frequency of occurrence of the representative symbol and the frequencies of occurrence of the K high-order symbols are all higher than 0. The code length calculation unit 381 determines a code length (the 0-th code length) 45 of the representative symbol and code lengths (K first code lengths) 46 of the K high-order symbols by using the Huffman tree 60 (step S206). The code length 45 of the representative symbol is sent to the merged symbol code length addition unit 382. The code lengths 46 of the K high-order symbols are sent to the canonical Huffman unit 326 and the code table compression unit 34.

In addition, the merged symbol number counting unit 373 acquires the number of symbols (merged symbols) C each having a frequency of occurrence higher than 0 among the (N-K) symbols included in the second part table 432 (step S207). The merged symbol additional code length determination unit 374 determines additional code lengths (C additional code lengths) of the C merged symbols by using a subtree based on the number of merged symbols C and the second part table 432 (step S208). The C additional code lengths are sent to the merged symbol code length addition unit 382.

Note that the procedure from step S204 to step S206 and the procedure from step S207 to step S208 may be performed in parallel.

Next, the merged symbol code length addition unit 382 adds each of the additional code lengths of the merged symbols to the code length 45 of the representative symbol to determine code lengths of the respective C merged symbols (step S209). The code lengths of the respective C merged symbols are sent to the canonical Huffman unit 326 and the code table compression unit 34.

The canonical Huffman unit 326 determines variable length codes that are to be assigned to the K high-order symbols, respectively and variable length codes that are to be assigned to the C merged symbols, respectively, by using the code lengths 46 of the K high-order symbols and the code lengths of the C merged symbols (step S210) and ends the code table generation process. The method of determining the variable length codes to be assigned to the symbols on the basis of the code lengths is as described above with reference to FIG. 13.

As described above, the code table generation unit 32 generates the code table 49 based on the frequencies of occurrence of one or more symbols included in the input data for each symbol. The code table generation unit 32 generates the Huffman tree having at most (K+1) leaf nodes, and thus, the number of leaf nodes (symbols) for which the Huffman tree is to be generated is reduced as compared with a case where the Huffman tree having at most N leaf nodes is generated. Therefore, in the code table generation unit 32, a processing amount for generating the code table 49 can be reduced.

Second Embodiment

The code table generation device 32 according to the first embodiment generates the Huffman tree 60 while regarding one or more low-order symbols included in the second part table 432 as one representative symbol. On the other hand, a code table generation device 32 according to a second embodiment generates a Huffman tree 60 while regarding one or more low-order symbols as two or more representative symbols. In the code table generation device 32 of the second embodiment, it can be expected that decrease in the coding efficiency can be reduced by increasing the number of representative symbols.

A configuration of the code table generation device 32 of the second embodiment is similar to that of the code table generation device 32 of the first embodiment. The second embodiment differs from the first embodiment only in the procedure of a process of generating a Huffman tree 60 while regarding one or more low-order symbols as two or more representative symbols and determining additional code lengths by using subtrees of merged symbols that are represented by the two or more representative symbols, respectively. Hereinafter, the difference from the first embodiment will be mainly described.

FIG. 16 illustrates an example of a configuration of a compression device 15 that includes the code table generation device 32 (the code table generation unit 32) in a case where the number of representative symbols is L. L is an integer equal to or greater than two. Note that in a case where L is one, the configuration is similar to that of the code table generation device 32 of the first embodiment illustrated in FIG. 7. FIG. 16 illustrates a configuration of the code table generation unit 32 in a case where there are two representative symbols (that is, L=2). Hereinafter, the two representative symbols will be referred to as a 0-th representative symbol and a first representative symbol.

The code table generation unit 32 includes, for example, a frequency counting unit 321, a frequency sorting unit 322, a symbol merge unit 323, a Huffman tree generation unit 324, a code length determination unit 325, and a canonical Huffman unit 326. The frequency counting unit 321 and the frequency sorting unit 322 are as described above in the first embodiment.

The symbol merge unit 323 includes a symbol distribution unit 371. The symbol merge unit 323 further includes sets of a representative symbol frequency estimation unit 372, a merged symbol number counting unit 373, and a merged symbol additional code length determination unit 374 that correspond to the number of representative symbols L. In the example illustrated in FIG. 16, the symbol merge unit 323 includes: a set of a 0-th representative symbol frequency estimation unit 372-0, a 0-th merged symbol number counting unit 373-0, and a 0-th merged symbol additional code length determination unit 374-0 corresponding to the 0-th representative symbol; and a set of a first representative symbol frequency estimation unit 372-1, a first merged symbol number counting unit 373-1, and a first merged symbol additional code length determination unit 374-1 corresponding to the first representative symbol.

The code length determination unit 325 includes a code length calculation unit 381. The code length determination unit 325 further includes merged symbol code length addition units 382 corresponding to the number of representative symbols L. In the example illustrated in FIG. 16, the code length determination unit 325 includes a 0-th merged symbol code length addition unit 382-0 corresponding to the 0-th representative symbol and a first merged symbol code length addition unit 382-1 corresponding to the first representative symbol.

The symbol distribution unit 371 divides the first frequency table 41 into (L+1) part tables. The first part table 441 includes top K entries among the N entries included in the first frequency table 41. The symbol distribution unit 371 divides the remaining (N-K) entries, which are obtained by excluding the top K entries from the N entries, into L sets (L symbol sets). The L sets are included in the L part tables, respectively.

Here, a case where N=256, K=32, and L=2 will be exemplified. In this case, the symbol distribution unit 371 divides the first frequency table 41 into the first part table 441, a second part table 442, and a third part table 443. The first part table 441 includes 32 entries from an index 0 to an index 31 among 256 entries included in the first frequency table 41. The second part table 442 includes 32 entries from an index 32 to an index 63 among the 256 entries included in the first frequency table 41. The third part table 443 includes 192 entries from an index 64 to an index 255 among the 256 entries included in the first frequency table 41.

The symbol distribution unit 371 sends the first part table 441 to the Huffman tree generation unit 324. The symbol distribution unit 371 sends the second part table 442 to the 0-th representative symbol frequency estimation unit 372-0, the 0-th merged symbol number counting unit 373-0, and the 0-th merged symbol additional code length determination unit 374-0. The symbol distribution unit 371 sends the third part table 443 to the first representative symbol frequency estimation unit 372-1, the first merged symbol number counting unit 373-1, and the first merged symbol additional code length determination unit 374-1.

An operation of the 0-th representative symbol frequency estimation unit 372-0 and an operation of the first representative symbol frequency estimation unit 372-1 are similar to that of the representative symbol frequency estimation unit 372 of the first embodiment.

Specifically, the 0-th representative symbol frequency estimation unit 372-0 estimates a frequency of occurrence of a 0-th representative symbol in order that one or more symbols (0-th low-order symbols) included in the second part table 442 are regarded as the 0-th representative symbol while the Huffman tree 60 is constructed. For example, the 0-th representative symbol frequency estimation unit 372-0 estimates the frequency of occurrence of the 0-th representative symbol by estimating the sum of the frequencies of occurrence of the one or more 0-th low-order symbols. The 0-th representative symbol frequency estimation unit 372-0 sends the frequency of occurrence of the 0-th representative symbol to the Huffman tree generation unit 324.

In addition, the first representative symbol frequency estimation unit 372-1 estimates a frequency of occurrence of a first representative symbol in order that one or more symbols (first low-order symbols) included in the third part table 443 are regarded as the first representative symbol while the Huffman tree 60 is constructed. For example, the first representative symbol frequency estimation unit 372-1 estimates the frequency of occurrence of the first representative symbol by estimating the sum of the frequencies of occurrence of the one or more first low-order symbols. The first representative symbol frequency estimation unit 372-1 sends the frequency of occurrence of the first representative symbol to the Huffman tree generation unit 324.

The Huffman tree generation unit 324 generates the Huffman tree 60 by using the first part table 441 and the frequency of occurrence of each of the L representative symbols. More specifically, the Huffman tree generation unit 324 generates a Huffman tree having leaf nodes that correspond to symbols each having a frequency of occurrence higher than 0 among the K high-order symbols and the L representative symbols. That is, the Huffman tree generation unit 324 performs processing of constructing a Huffman tree having at most (K+L) leaf nodes. The Huffman tree generation unit 324 sends the generated Huffman tree 60 to the code length determination unit 325 (more specifically, the code length calculation unit 381).

An operation of the 0-th merged symbol number counting unit 373-0 and an operation of the first merged symbol number counting unit 373-1 are similar to that of the merged symbol number counting unit 373 of the first embodiment. An operation of the 0-th merged symbol additional code length determination unit 374-0 and an operation of the first merged symbol additional code length determination unit 374-1 are similar to that of the merged symbol additional code length determination unit 374 of the first embodiment.

Specifically, the 0-th merged symbol number counting unit 373-0 and the 0-th merged symbol additional code length determination unit 374-0 determine additional code lengths of C merged symbols (hereinafter, referred to as 0-th merged symbols) that are represented by the 0-th representative symbol. C is an integer equal to or greater than 0. The 0-th merged symbols are symbols each having a frequency of occurrence higher than 0 among the symbols included in the second part table 442. The 0-th merged symbol additional code length determination unit 374-0 sends the determined additional code lengths to the 0-th merged symbol code length addition unit 382-0.

In addition, the first merged symbol number counting unit 373-1 and the first merged symbol additional code length determination unit 374-1 determine additional code lengths of the C' merged symbols (hereinafter, referred to as first merged symbols) that are represented by the first representative symbol. C' is an integer equal to or greater than 0. The first merged symbols are symbols each having a frequency of occurrence higher than 0 among the symbols included in the third part table 443. The first merged symbol additional code length determination unit 374-1 sends the determined additional code lengths to the first merged symbol code length addition unit 382-1.

The code length determination unit 325 determines code lengths of the K high-order symbols included in the first part table 441, code lengths of the C 0-th merged symbols, and code lengths of the C' first merged symbols by using the Huffman tree 60, the additional code lengths of the C 0-th merged symbols, and the additional code lengths of the C' first merged symbols. Note that it is assumed here that the frequencies of occurrence of the K high-order symbols, the frequency of occurrence of the 0-th representative symbol, and the frequency of occurrence of the first representative symbol are all higher than 0.

Specifically, the code length calculation unit 381 of the code length determination unit 325 determines the code lengths (first code lengths 46) of the K high-order symbols, a code length (hereinafter, referred to as a 0-th code length 471) of the 0-th representative symbol, and a code length (hereinafter, referred to as a 0'-th code length 472) of the first representative symbol by using the Huffman tree 60. A method for determining a code length of each symbol by using the Huffman tree 60 is as described above.

The code length calculation unit 381 sends the determined 0-th code length 471 of the 0-th representative symbol to the 0-th merged symbol code length addition unit 382-0. The code length calculation unit 381 sends the determined 0'-th code length 472 of the first representative symbol to the first merged symbol code length addition unit 382-1. The code length calculation unit 381 sends the determined K first code lengths 46 that correspond to the K high-order symbols, respectively, to the code table compression unit 34 and the canonical Huffman unit 326.

The 0-th merged symbol code length addition unit 382-0 determines code lengths (hereinafter, 0-th merged symbol code lengths) of the C 0-th merged symbols by using the 0-th code length 471 and the C additional code lengths respectively corresponding to the C 0-th merged symbols. Specifically, the 0-th merged symbol code length addition unit 382-0 determines, for each of the C 0-th merged symbols, a code length of a symbol of the 0-th merged symbols by adding the additional code length corresponding to the symbol to the 0-th code length 471. The 0-th merged symbol code length addition unit 382-0 sends the C 0-th merged symbol code lengths to the code table compression unit 34 and the canonical Huffman unit 326.

The first merged symbol code length addition unit 382-1 determines code lengths (hereinafter, referred to as first merged symbol code lengths) of the C' first merged symbols by using the 0'-th code length 472 and the C' additional code lengths respectively corresponding to the C' first merged symbols. Specifically, the first merged symbol code length addition unit 382-1 determines, for each of the C' first merged symbols, a code length of a symbol of the first merged symbols by adding the additional code lengths corresponding to the symbol to the 0'-th code length 472. The first merged symbol code length addition unit 382-1 sends the C' first merged symbol code lengths to the code table compression unit 34 and the canonical Huffman unit 326.

The canonical Huffman unit 326 generates the code table 49 according to the canonical Huffman coding by using the K first code lengths 46, the C 0-th merged symbol code lengths, and the C' first merged symbol code lengths. The method for generating the code table 49 based on the code lengths is as described in the first embodiment.

The code table compression unit 34 performs compression processing on the K first code lengths 46, the C 0-th merged symbol code lengths, and the C' first merged symbol code lengths. For example, the code table compression unit 34 sorts the K first code lengths 46, the C 0-th merged symbol code lengths, and the C' first merged symbol code lengths in the specific symbol order, performs run-length encoding on the sorted code lengths, and further performs Huffman encoding on the result of run-length encoding. Accordingly, the compressed code table 49 is acquired.

As described above, the number L of representative symbols that represent one or more low-order symbols can be freely set. The code table generation unit 32 includes sets of the representative symbol frequency estimation unit 372, the merged symbol number counting unit 373, the merged symbol additional code length determination unit 374, and the merged symbol code length addition unit 382 that correspond to the number L of representative symbols.

By increasing the number L of representative symbols, frequencies of occurrence of the L representative symbols are estimated respectively using the increased L part tables. By using the frequencies of occurrence of the increased L representative symbols, for example, in a case where tendency of the frequencies of occurrence of one or more low-order symbols greatly changes in the middle, the change in the tendency of the frequencies of occurrence is easily reflected in generation of the Huffman tree 60. Thus, by increasing the number L of the representative symbols in the code table generation unit 32, decrease in the coding efficiency in the compression device 15 can be reduced. The number L of the representative symbols is determined in consideration of, for example, a processing amount required for generating the Huffman tree and the coding efficiency.

As described above, according to the code table generation device 32 of the first and second embodiments, the processing amount for generating a code table can be reduced. The frequency counting unit 321 generates a frequency table including a plurality of symbols and a plurality of frequencies of occurrence that are associated with the plurality of symbols, respectively, based on a frequency of occurrence for each symbol of input symbols. The frequency sorting unit 322 sorts the plurality of symbols and the plurality of frequencies of occurrence in the frequency table in descending order of the frequencies of occurrence. The symbol merge unit 323 (more specifically, the symbol distribution unit 371) acquires top K symbols and the remaining symbols from the sorted plurality of symbols and divides the remaining symbols into one or more symbol sets. The symbol merge unit 323 (more specifically, the representative symbol frequency estimation unit 372) determines a frequency of occurrence associated with a root node (that is, a representative symbol) of each of one or more subtrees that correspond to the one or more symbol sets, respectively. The Huffman tree generation unit 324 generates a Huffman tree 60 by using the K symbols and the root node of each of the one or more subtrees. The code length determination unit 325 determines a plurality of code lengths that correspond to the plurality of symbols, respectively, based on the Huffman tree 60 and the one or more subtrees. The canonical Huffman unit 326 determines a plurality of codes that are assigned to the plurality of symbols, respectively, based on the plurality of code lengths. Note that K is an integer equal to or greater than one and equal to or less than the number of symbols.

Since the code table generation device 32 generates the Huffman tree having leaf nodes that correspond to at most the sum of K and the number of the one or more subtrees, the number of leaf nodes (symbols) for generating the Huffman tree is reduced as compared with a case where a Huffman tree having leaf nodes that correspond to at most the number of symbols is generated. Thus, in the code table generation device 32, a processing amount for generating the code table can be reduced.

Each of various functions described in the first and second embodiments may be realized by a circuit (e.g., a processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A code table generation device comprising:
   a frequency table generation unit configured to generate a frequency table based on a frequency of occurrence for each symbol of input symbols, the frequency table including a plurality of symbols and a plurality of frequencies of occurrence that are associated with the plurality of symbols, respectively;
   a frequency sorting unit configured to sort the plurality of symbols and the plurality of frequencies of occurrence in the frequency table in descending order of the frequencies of occurrence;
   a symbol merge unit configured to:
      acquire top K symbols and remaining symbols from the sorted plurality of symbols;
      divide the remaining symbols into one or more symbol sets; and
      determine a frequency of occurrence associated with a root node of each of one or more subtrees that correspond to the one or more symbol sets, respectively;
   a Huffman tree generation unit configured to generate a Huffman tree by using the K symbols and the root node of each of the one or more subtrees;
   a code length determination unit configured to determine a plurality of code lengths that correspond to the plurality of symbols, respectively, based on the Huffman tree and the one or more subtrees; and
   a code determination unit configured to determine a plurality of codes that are assigned to the plurality of symbols, respectively, based on the plurality of code lengths,
   wherein the K is an integer equal to or greater than one and equal to or less than a number of the plurality of symbols.

2. The code table generation device according to claim 1, wherein each of the one or more subtrees is a subtree having one or more leaf nodes, and
   the one or more leaf nodes correspond to one or more symbols, respectively, that are included in a symbol set of the one or more symbol sets and have frequencies of occurrence greater than 0.

3. The code table generation device according to claim 2, wherein
   each of the one or more subtrees is a balanced binary tree.

4. The code table generation device according to claim 3, wherein
   the one or more subtrees include a first subtree, and
   the one or more symbol sets include a first symbol set corresponding to the first subtree, and
   the symbol merge unit is configured to determine a frequency of occurrence associated with a root node of the first subtree by using a frequency of occurrence associated with at least one of one or more symbols included in the first symbol set.

5. The code table generation device according to claim 4, wherein
   each of the plurality of symbols is a symbol whose frequency of occurrence is greater than 0.

6. The code table generation device according to claim 1, wherein
   each of the one or more subtrees is a balanced binary tree.

7. The code table generation device according to claim 1, wherein the one or more subtrees include a first subtree, and the one or more symbol sets include a first symbol set corresponding to the first subtree, and the symbol merge unit is configured to determine a frequency of occurrence associated with a root node of the first subtree by using a frequency of occurrence associated with at least one of one or more symbols included in the first symbol set.

8. The code table generation device according to claim 1, wherein each of the plurality of symbols is a symbol whose frequency of occurrence is greater than 0.

9. A memory system comprising:

a nonvolatile memory; and a controller including the code table generation device according to claim 1 and an encoding unit, wherein the encoding unit is configured to convert the input symbols into codes in accordance with the plurality of codes that are assigned to the plurality of symbols, respectively, and the controller is configured to write data that includes the codes, into the nonvolatile memory.

10. A code table generation method comprising:

generating a frequency table based on a frequency of occurrence for each symbol of input symbols, the frequency table including a plurality of symbols and a plurality of frequencies of occurrence that are associated with the plurality of symbols, respectively;

acquiring top K symbols and remaining symbols from the plurality of symbols that are sorted in descending order of the frequencies of occurrence;

dividing the remaining symbols into one or more symbol sets;

determining a frequency of occurrence associated with a root node of each of one or more subtrees that correspond to the one or more symbol sets, respectively;

generating a Huffman tree by using the K symbols and the root node of each of the one or more subtrees;

determining a plurality of code lengths that correspond to the plurality of symbols, respectively, based on the Huffman tree and the one or more subtrees; and determining a plurality of codes that are assigned to the plurality of symbols, respectively, based on the plurality of code lengths, wherein the K is an integer equal to or greater than one and equal to or less than a number of the plurality of symbols.

11. The code table generation method according to claim 10, wherein each of the one or more subtrees is a subtree having one or more leaf nodes, and the one or more leaf nodes correspond to one or more symbols, respectively, that are included in a symbol set of the one or more symbol sets and have frequencies of occurrence greater than 0.

12. The code table generation method according to claim 11, wherein each of the one or more subtrees is a balanced binary tree.

13. The code table generation method according to claim 12, wherein the one or more subtrees include a first subtree, the one or more symbol sets include a first symbol set corresponding to the first subtree, and determining the frequency of occurrence associated with the root node of each of the one or more subtrees comprises determining a frequency of occurrence associated with a root node of the first subtree by using a frequency of occurrence associated with at least one of one or more symbols included in the first symbol set.

14. The code table generation method according to claim 13, wherein each of the plurality of symbols is a symbol whose frequency of occurrence is greater than 0.

15. The code table generation method according to claim 10, wherein each of the one or more subtrees is a balanced binary tree.

16. The code table generation method according to claim 10, wherein the one or more subtrees include a first subtree, the one or more symbol sets include a first symbol set corresponding to the first subtree, and determining the frequency of occurrence associated with the root node of each of the one or more subtrees comprises determining a frequency of occurrence associated with a root node of the first subtree by using a frequency of occurrence associated with at least one of one or more symbols included in the first symbol set.

17. The code table generation method according to claim 10, wherein each of the plurality of symbols is a symbol whose frequency of occurrence is greater than 0.

* * * * *